US009063518B2

(12) United States Patent
Koscielnik et al.

(10) Patent No.: US 9,063,518 B2
(45) Date of Patent: Jun. 23, 2015

(54) METHOD AND APPARATUS FOR CONVERSION OF TIME INTERVAL TO DIGITAL WORD

(75) Inventors: Dariusz Koscielnik, Krakow (PL); Marek Miskowicz, Krakow (PL)

(73) Assignee: AKADEMIA GORNICZO-HUTNICZA IM. STANISLAWA STASZICA, AL., Krakow (PL)

( * ) Notice: Subject to any disclaimer, the term of this patent is extended or adjusted under 35 U.S.C. 154(b) by 169 days.

(21) Appl. No.: 13/702,159

(22) PCT Filed: Jun. 5, 2011

(86) PCT No.: PCT/PL2011/050021
§ 371 (c)(1), (2), (4) Date: May 6, 2013

(87) PCT Pub. No.: WO2011/152744
PCT Pub. Date: Dec. 8, 2011

(65) Prior Publication Data

US 2013/0222170 A1 Aug. 29, 2013

(30) Foreign Application Priority Data

Jun. 5, 2010 (PL) ........................................ 391418
Nov. 10, 2010 (PL) ........................................ 392925

(51) Int. Cl.
*H03M 1/50* (2006.01)
*G04F 10/00* (2006.01)

(52) U.S. Cl.
CPC ............. *G04F 10/00* (2013.01); *G04F 10/005* (2013.01)

(58) Field of Classification Search
CPC ............................... G04F 10/00; G04F 10/005
USPC .......................... 341/155, 161, 163, 172, 166
See application file for complete search history.

(56) References Cited

U.S. PATENT DOCUMENTS 8,362,932 B2 * 1/2013 Pavlovic et al. .............. 341/111
8,471,736 B1 * 6/2013 Booth et al. .................. 341/115
8,564,471 B1 * 10/2013 Gao et al. ...................... 341/166

*Primary Examiner* — Brian Young
(74) *Attorney, Agent, or Firm* — Ladas & Parry LLP

(57) ABSTRACT

The solution according to the invention consisting in conversion of a time interval to a digital word of a number of bits equal to n by the use of the array (A) of binary-scaled capacitors ($C_{n-1}, \ldots, C_0$) is characterized in that the time interval whose both start and end are detected by the control module (CM) is first mapped to a portion of electric charge delivered by the current source (I) and successively accumulated in the capacitors (($C_{n-1}, \ldots, C_0$)) in the order of decreasing capacitances starting from the capacitor ($C_{n-1}$) having the highest capacitance value in the array, and when the control module (CM) detects the end of the time interval, the charge accumulated in the capacitor ($C_x$) charged recently is successively transferred by the use of the current source (I) to the capacitors of lower capacitance values. The process of charge transfer is controlled by the control module (CM) on the basis of the output signals of the comparators (K1) and (K2) without the use of a clock while the value one is assigned to these bits ($b_{n-1}, \ldots, b_0$) in the digital output word that correspond to the capacitors ($C_{n-1}, \ldots, C_0$) on which the reference voltage ($U_L$) of a desired value has been obtained, and the value zero is assigned to the other bits.

14 Claims, 18 Drawing Sheets

METHOD AND APPARATUS FOR CONVERSION OF TIME INTERVAL TO DIGITAL WORD

Figure 1:
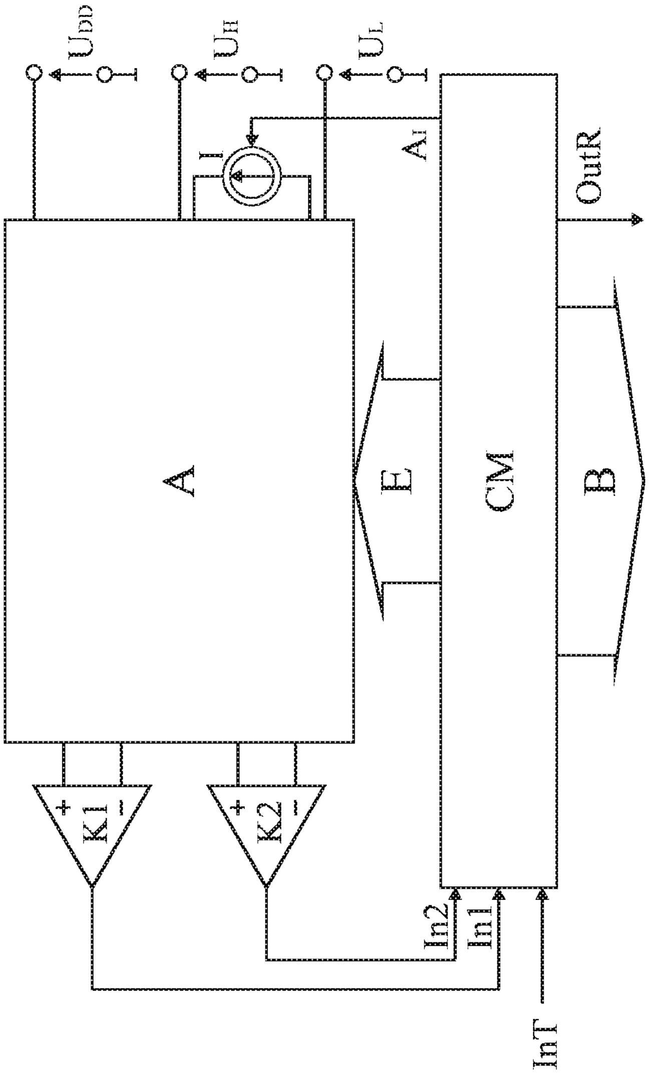

The subject of this invention is a method and an apparatus for conversion of a time interval to a digital word that can be applied to measurements of pulse widths in monitoring and control systems.

The method for the conversion of a time interval to a digital word known from the international patent application WO2008/123786 consists in counting periods of the reference clock during each pulse whose leading and trailing edges define respectively the start and the end of the converted time interval. The number of counted reference clock periods corresponding to the difference between the final state and the initial state of the counter represents the converted time interval.

The apparatus for the conversion of analog signals to digital signals with asynchronous Sigma-Delta modulation known from the international patent application WO2008/123786 containing converter of the time interval to the digital word comprises the counter whose input programming its initial state is connected to the setup register, whereas the counting input of the counter is connected to the output of the reference clock that is, on the other hand, connected to the input of the control module. The other input of the control module is connected to the output the asynchronous Sigma-Delta modulator whereas the converted analog signal is provided to the input the asynchronous Sigma-Delta modulator. The output of the counter is connected to the intermediate buffer whose input is on the other hand connected to the transmitting buffer while the output of the transmitting buffer is the output the output of the apparatus at the same time. The outputs of the control module are connected to the control inputs of the intermediate buffer and of the transmitting buffer respectively, and also to the input of the counter used for programming its initial state.

The method according to the invention is characterized in that the time interval, whose both start and end are detected by the use of the control module, is mapped to a portion of electric charge proportional to the time interval, while the portion of electric charge is delivered during the time interval by the use of the current source and is accumulated in an array of capacitors whereas a capacitance value of a capacitor of a given index is twice as high as a capacitance value of the capacitor of the previous index. Charge accumulation is started from the capacitor having the highest capacitance value in the array of capacitors and is realized from the start of the time interval to the end of the time interval detected by means of the control module or until the voltage, which increases on the capacitor having the highest capacitance value in the array of capacitors and is simultaneously observed by the use of the second comparator, equals the reference voltage value. In this case the charge accumulation is continued in the subsequent capacitor in the array of capacitors whose capacitance value is twice lower than the capacitance value of the capacitor in which charge was accumulated directly before and at the same time the voltage increasing on the capacitor, in which charge is currently accumulated, is compared to the reference voltage value by the use of the second comparator. The cycle is repeated until the end of the time interval is detected by means of the control module. Afterwards, by writing the value of the index of the capacitor, which is the last capacitor in which charge was accumulated, the function of the source capacitor, whose index is defined by the content of the source capacitor index register in the control module, is assigned by means of the control module to the capacitor in the array of capacitors which is the last capacitor in which charge was accumulated. At the same time, by writing the value of the source capacitor index register reduced by one to the destination capacitor index register, the function of the destination capacitor whose index is defined by the content of the destination capacitor index register in the control module is assigned by means of the control module to the subsequent capacitor in the array whose capacitance value is twice lower than the capacitance value of the source capacitor. Then, the electric charge accumulated in the source capacitor is transferred to the destination capacitor by the use of the current source. At the same time, the voltage increasing on the destination capacitor is compared to the reference voltage value by the use the second comparator, and also the voltage on the source capacitor is observed by the use of the first comparator. When the voltage on the source capacitor observed by the use of the first comparator equals zero during the charge transfer, the function of the source capacitor is assigned to the current destination capacitor by means of the control module on the basis of the output signal of the first comparator by writing the current content of the destination capacitor index register in the control module to the source capacitor index register in the control module, and also the function of the destination capacitor is assigned to the subsequent capacitor in the array whose capacitance value is twice lower than the capacitance value of the capacitor that operated as the destination capacitor directly before by reducing the content of the destination capacitor index register by one, and charge transfer from a new source capacitor to a new destination capacitor is continued by the use of the current source. When the voltage on the destination capacitor observed by the use of the second comparator equals the reference voltage value during the transfer of charge from the source capacitor to the destination capacitor, the function of the destination capacitor is assigned by means of the control module on the basis of the output signal of the second comparator to the subsequent capacitor in the array whose capacitance value is twice lower than the capacitance value of the capacitor that operated as the destination capacitor directly before by reducing the content of the destination capacitor index register by one. Next, the charge transfer from a source capacitor to a new destination capacitor is continued, while this process is still controlled by means of the control module on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage increasing on the capacitor of the lowest capacitance value in the array and observed at the same time by the use of the second comparator equals the reference voltage value while the value one is assigned to these bits in the digital word corresponding to the capacitors in the array of capacitors on which the voltage equal to the reference voltage value has been obtained, and the value zero is assigned to the other bits by means of the control module.

In the another variant of the method, electric charge is delivered by the use of the current source and is accumulated in the sampling capacitor during the time interval whose both start and end are detected by means of the control module, and after detecting the end of the time interval by means of the control module, the function of the source capacitor whose index is defined by the content of the source capacitor index register in the control module is assigned by means of the control module to the sampling capacitor by writing the value of the index of the sampling capacitor to the source capacitor index register, and also the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register. After that, the process of electric charge transfer from the source capacitor to the destination capacitor is realized by the use of the current source on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, electric charge is delivered by the use of the current source and is accumulated during the time interval whose both start and end are detected by means of the control module in the capacitor having the highest capacitance value in the array of capacitors and at the same time in the sampling capacitor connected in parallel to the capacitor having the highest capacitance value in the array of capacitors where the capacitance value of the sampling capacitor is not smaller than the capacitance value of the capacitor having the highest capacitance value in the array of capacitors. Next, after detecting the end of the time interval by means of the control module, the function of the source capacitor whose index is defined by the content of the source capacitor index register in the control module is assigned by means of the control module to the sampling capacitor by writing the value of the index of the sampling capacitor to the source capacitor index register, and also the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register. Afterwards, the process of the electric charge transfer from the source capacitor to the destination capacitor is realized by the use of the current source on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, after detecting the end of the time interval by means of the control module and after writing the values of indexes of relevant capacitors to the source capacitor index register and to the destination capacitor index register by means of the control module, the process of charge redistribution is realized during which charge is transferred from the source capacitor to the destination capacitor by the use of the additional current source, whose effectiveness is different from the effectiveness of the current source, and the process of charge redistribution is controlled by means of the control module on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, electric charge is delivered by the use of the current source and is accumulated in the sampling capacitor during the time interval whose both start and end are detected by means of the control module, and after detecting the end of the time interval by means of the control module, the function of the source capacitor whose index is defined by the content of the source capacitor index register in the control module is assigned by means of the control module to the sampling capacitor by writing the value of the index of the sampling capacitor to the source capacitor index register, and also the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register, and after that, the process of redistribution of accumulated electric charge is realized during which charge is transferred from the source capacitor to the destination capacitor by the use of the additional current source whose effectiveness is different from the effectiveness of the current source and the process of charge redistribution is realized on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

In the another variant of the method, electric charge is delivered by the use of the current source and accumulated during the time interval whose start and whose end are detected by means of the control module in the capacitor having the highest capacitance value in the array of capacitors and at the same time in the sampling capacitor connected in parallel to the capacitor having the highest capacitance value in the array of capacitors where the capacitance value of the sampling capacitor is not smaller than the capacitance value of the capacitor having the highest capacitance value in the array of capacitors, and after detecting the end of the time interval by means of the control module, the function of the source capacitor whose index is defined by the content of the source capacitor index register in the control module is assigned by means of the control module to the sampling capacitor by writing the value of the index of the sampling capacitor to the source capacitor index register, and also the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array of capacitors to the destination capacitor index register, and after that, the process of redistribution of accumulated electric charge is realized during which charge is transferred from the source capacitor to the destination capacitor by the use of the additional current source whose effectiveness is different from the effectiveness of the current source, and the process of charge redistribution is realized on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor having the lowest capacitance value in the array of capacitors and is simultaneously observed by the use of the second comparator, equals the reference voltage value.

Apparatus according to the invention containing the control module equipped with the digital output is characterized in that the apparatus comprises the array of capacitors whose control inputs are connected to the set of control outputs of the control module, and the control module is equipped with the digital output, the complete conversion signal output, the time interval signal input and two control inputs where the first control input is connected to the output of the first comparator whose inputs are connected to one pair of outputs of the array of capacitors, and the other control input of the control module is connected to the output of the second comparator whose inputs are connected to the other pair of outputs of the array, and furthermore, the voltage supply, the source of auxiliary voltage together with the source of the reference voltage and the controlled current source are connected to the array of capacitors, and the control input of the controlled current source is connected to the relevant control output of the control module.

In this variant of the apparatus, the array comprises a number of n capacitors, and a capacitance value of a capacitor of a given index is twice as high as a capacitance value of the capacitor of the previous index, and the top plate of the capacitor having the highest capacitance value in the array of capacitors is connected through the closed first on-off switch to the first rail with which the top plates of the other capacitors in the array are connected through the open first on-off switches while the top plate of the capacitor having the highest capacitance value in the array of capacitors is also connected through the closed second on-off switch to the second rail with which the top plates of the other capacitors in the array are connected through the open second on-off switches. On the other hand, the bottom plate of the capacitor having the highest capacitance value in the array of capacitors is connected to the ground of the circuit through the change-over switch whose moving contact is connected to its first stationary contact and the other stationary contact of the change-over switch is connected to the source of auxiliary voltage and also to the non-inverting input of the first comparator while the bottom plates of the other capacitors in the array are connected to the source of auxiliary voltage through the change-over switches whose moving contacts are connected to their other stationary contacts, and the first stationary contacts of the change-over switches are connected to the ground of the circuit. The first rail is connected to the ground of the circuit through the open first rail on-off switch and to the non-inverting input of the second comparator whose inverting input is connected to the source of the reference voltage, while the second rail is connected to the inverting input of the first comparator. The control inputs of the first on-off switches and the control inputs of the change-over switches in the array are coupled together and connected to the relevant control outputs of the control module, while the control inputs of the second on-off switches and the control input of the first rail on-off switch are connected to the relevant control outputs of the control module. On the other hand, one end of the current source is connected to the voltage supply through the current source change-over switch whose moving contact is connected to its first stationary contact, and the other stationary contact of the current source change-over switch is connected to the second rail, and the other end of the current source is connected to the first rail, and furthermore, the control input of the current source is connected to the relevant control output of the control module, and the control input of the current source change-over switch is connected to the relevant control output of the control module.

In the another version of this apparatus variant, the sampling capacitor is connected to the array of capacitors, while the top plate of the sampling capacitor is connected to the first rail through the closed first on-off switch and also it is connected to the second rail through the open second on-off switch, whereas the bottom plate of the sampling capacitor is connected to the ground of the circuit through the change-over switch whose moving contact is connected to its first stationary contact, and the other stationary contact of the change-over switch is connected to the source of auxiliary voltage. The control input of the first on-off switch and the control input of the change-over switch are coupled together and connected to the control output of the control module, whereas the control input of the second on-off switch is connected to the other control output of the control module. Furthermore, the top plate of the capacitor having the highest capacitance value in the array of capacitors is connected to the first rail through the open first on-off switch and to the second rail through the closed second on-off switch, while the bottom plate of the capacitor having the highest capacitance value in the array of capacitors is connected to the source of auxiliary voltage through the change-over switch whose moving contact is connected to its other stationary contact, whereas the first stationary contact of the change-over switch is connected to the ground of the circuit.

In the another version of this apparatus variant, the sampling capacitor is connected to the array of capacitors where the capacitance value of the sampling capacitor is not smaller than the capacitance value of the capacitor having the highest capacitance value in the array of capacitors, while the sampling capacitor is connected in parallel to the capacitor having the highest capacitance value in the array of capacitors through the first rail and through the ground of the circuit in a way that the top plate of the sampling capacitor is connected to the first rail through the closed first on-off switch, and on the other hand, the bottom plate of the sampling capacitor is connected to the ground of the circuit through the change-over switch whose moving contact is connected to its first stationary contact, and the other stationary contact of the change-over switch is connected to the source of auxiliary voltage. Moreover, the top plate of the sampling capacitor is connected also to the second rail through the open second on-off switch, whereas the control input of the first on-off switch and the control input of the change-over switch are coupled together and connected to the control output of the control module, and the control input of the second on-off switch is connected to the other control output of the control module.

In the another variant of the apparatus, a controlled additional current source is connected to the array of capacitors, and the control input of the additional current source is connected to the relevant control output of the control module.

In this variant of the apparatus, the array of capacitors comprises a number of n capacitors, and a capacitance value of a capacitor of a given index is twice as high as a capacitance value of the capacitor of the previous index. The top plate of the capacitor having the highest capacitance value in the array of capacitors is connected through the closed first on-off switch to the first rail with which the top plates of the other capacitors in the array of capacitors are connected through the open first on-off switches, while the top plate of the capacitor having the highest capacitance value in the array of capacitors is also connected through the closed second on-off switch to the second rail with which the top plates of the other capacitors in the array are connected through the open second on-off switches. On the other hand, the bottom plate of the capacitor having the highest capacitance value in the array of capacitors is connected to the ground of the circuit through the change-over switch whose moving contact is connected to its first stationary contact and the other stationary contact of the change-over switch is connected to the source of auxiliary voltage and also to the non-inverting input of the first comparator, while the bottom plates of the other capacitors in the array are connected to the source of auxiliary voltage through the change-over switches whose moving contacts are connected to their other stationary contacts, and the first stationary contacts of the change-over switches are connected to the ground of the circuit. The first rail is connected to the ground of the circuit through the open first rail on-off switch and to the non-inverting input of the second comparator whose inverting input is connected to the source of the reference voltage, while the second rail is connected to the inverting input of the first comparator. The control inputs of the first on-off switches and the control inputs of the change-over switches in the array are coupled together and connected to the relevant control outputs of the control module while the control inputs of the second on-off switches and the control input of the first rail on-off switch are connected to the relevant control outputs of the control module. Furthermore, one end of the current source is connected to the voltage supply, and the other end of the current source is connected to the first rail with which also the other end of the additional current source is connected. One end of the additional current source is connected to the second rail, and the control input of the current source is connected to the relevant control output of the control module while the control input of the additional current source is connected to the other control output of the control module.

In the another version of this apparatus variant, the sampling capacitor is connected to the array of capacitors while the top plate of the sampling capacitor is connected to the first rail through the closed first on-off switch and also it is connected to the second rail through the closed second on-off switch, whereas the bottom plate of the sampling capacitor is connected to the ground of the circuit through the change-over switch whose moving contact is connected to its first stationary contact, and the other stationary contact of the change-over switch is connected to the source of auxiliary voltage. The control input of the first on-off switch and the control input of the change-over switch are coupled together and connected to the relevant control output of the control module, whereas the control input of the second on-off switch is connected to the other control output of the control module, and also the top plate of the capacitor having the highest capacitance value in the array of capacitors is connected to the first rail through the open first on-off switch and to the second rail through the open second on-off switch, while the bottom plate of the capacitor having the highest capacitance value in the array of capacitors is connected to the source of auxiliary voltage through the change-over switch whose moving contact is connected to its other stationary contact, whereas the first stationary contact of the change-over switch is connected to the ground of the circuit.

In the another version of this apparatus variant, the sampling capacitor is connected to the array of capacitors where the capacitance value of the sampling capacitor is not smaller than the capacitance value of the capacitor having the highest capacitance value in the array of capacitors, while the sampling capacitor is connected in parallel to the capacitor having the highest capacitance value in the array of capacitors through the first rail and through the ground of the circuit in a way that the top plate of the sampling capacitor is connected to the first rail through the closed first on-off switch, and on the other hand, the bottom plate of the sampling capacitor is connected to the ground of the circuit through the change-over switch whose moving contact is connected to its first stationary contact, and the other stationary contact of the change-over switch is connected to the source of auxiliary voltage. Moreover, the top plate of the sampling capacitor is connected also to the second rail through the closed second on-off switch, whereas the control input of the first on-off switch and the control input of the change-over switch are coupled together and connected to the relevant control output of the control module, and the control input of the second on-off switch is connected to the other control output of the control module while the top plate of the capacitor having the highest capacitance value in the array of capacitors is connected to the first rail through the closed first on-off switch and also to the second rail through the open second on-off switch whereas the bottom plate of the capacitor having the highest capacitance value in the array of capacitors is connected to the ground of the circuit through the change-over switch whose moving contact is connected to its other stationary contact, whereas the first stationary contact of the change-over switch is connected to the source of auxiliary voltage.

The method and the apparatus for conversion of a time interval to a digital word according to the invention is characterized by simplicity of design. Furthermore, the use of the external gate signal and the comparators output signals for indication of instants of appropriate state transitions in the apparatus enables an external source of clock signal consuming considerable amount of energy to be eliminated, and thus, it causes a significant reduction of energy consumption by the apparatus. The conversion process according to the invention allows the number of state transitions in the circuit to be reduced multiple times for a given resolution compared to the known solutions which use counting reference clock periods. Since the amount of energy needed to realize a conversion cycle is proportional to the number of state transitions in the circuit, the solution according to the invention enables the reduction of energy consumed by the conversion apparatus. The use of an additional sampling capacitor for the accumulation of the converted electric charge allows a means of controlling apparatus operation to be simplified. The accumulation of charge in the additional sampling capacitor and at the same time in the capacitor having the highest capacitance value in the array of capacitors allows the required capacitance value of the sampling capacitor to be reduced twice with the same maximum value of voltage obtained on the sampling capacitor. Moreover, it also allows the duration of the transfer of charge accumulated in the sampling capacitor to subsequent capacitors in the array to be decreased. The use of an additional current source whose effectiveness is higher from the effectiveness of the current source allows the duration of the charge redistribution process to be reduced compared to the solution that does not use the additional current source. On the other hand, the maximum time of the charge redistribution process with the additional current source can be reduced many times compared to the maximum duration of converted time intervals.

The solution according to the invention is presented in the following figures.

FIG. 1—illustrates a block diagram of the apparatus.

Figure 2:
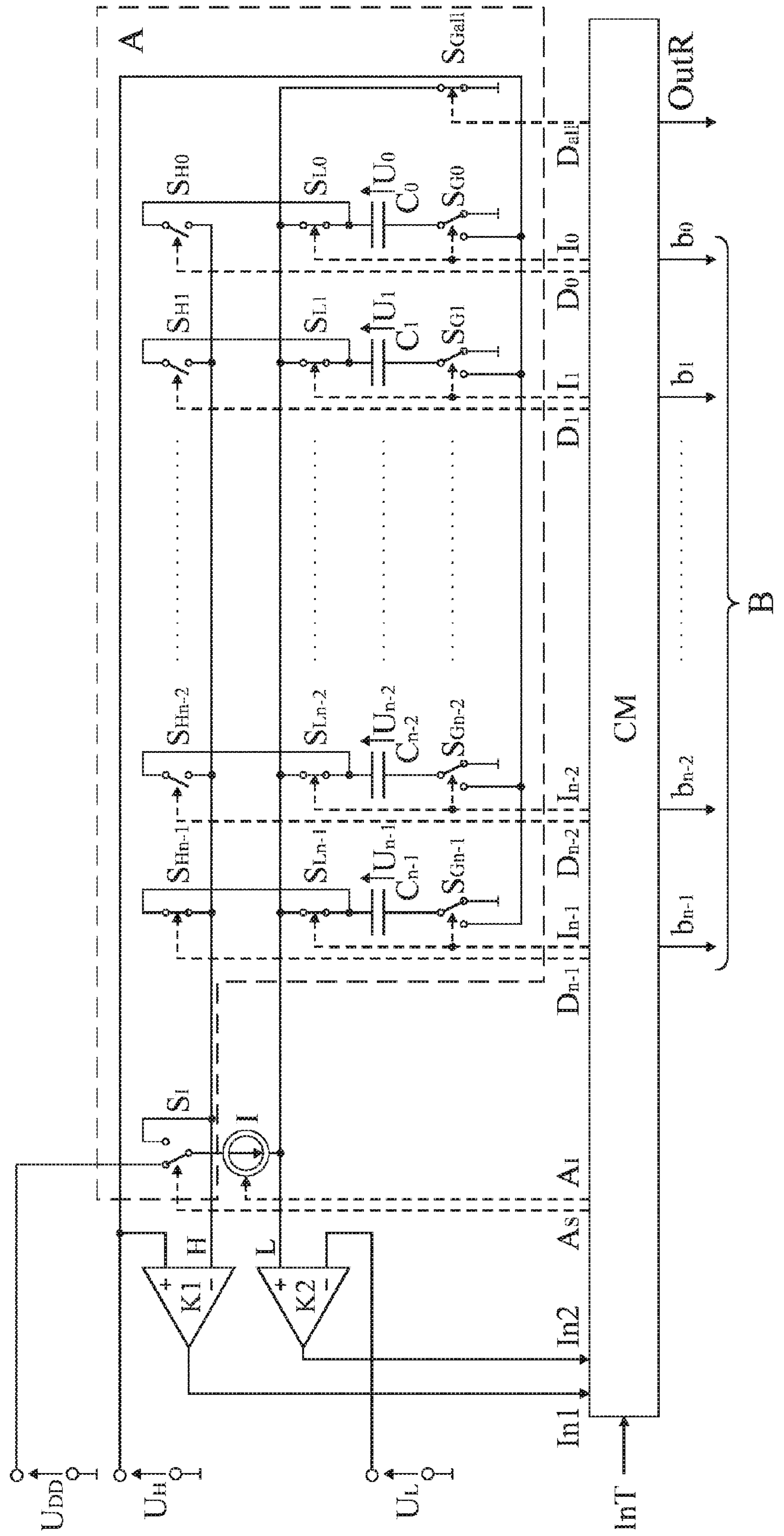

FIG. 2—illustrates the schematic diagram of the apparatus in the relaxation phase.

Figure 3:
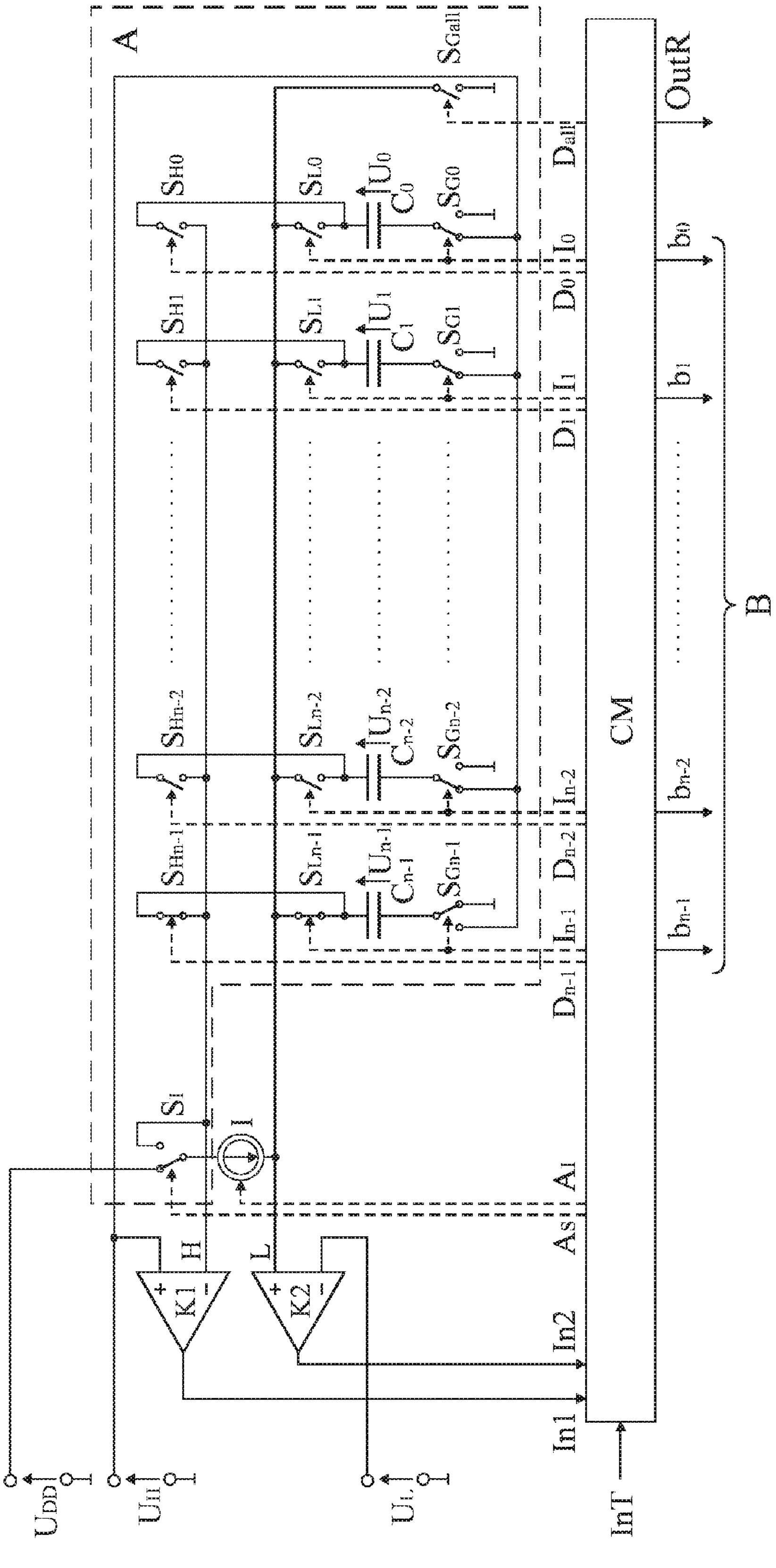

FIG. 3—illustrates the schematic diagram of the apparatus after detecting the start of the time interval at time of starting the charge accumulation in the capacitor $C_{n-1}$ in the array of capacitors.

Figure 4:
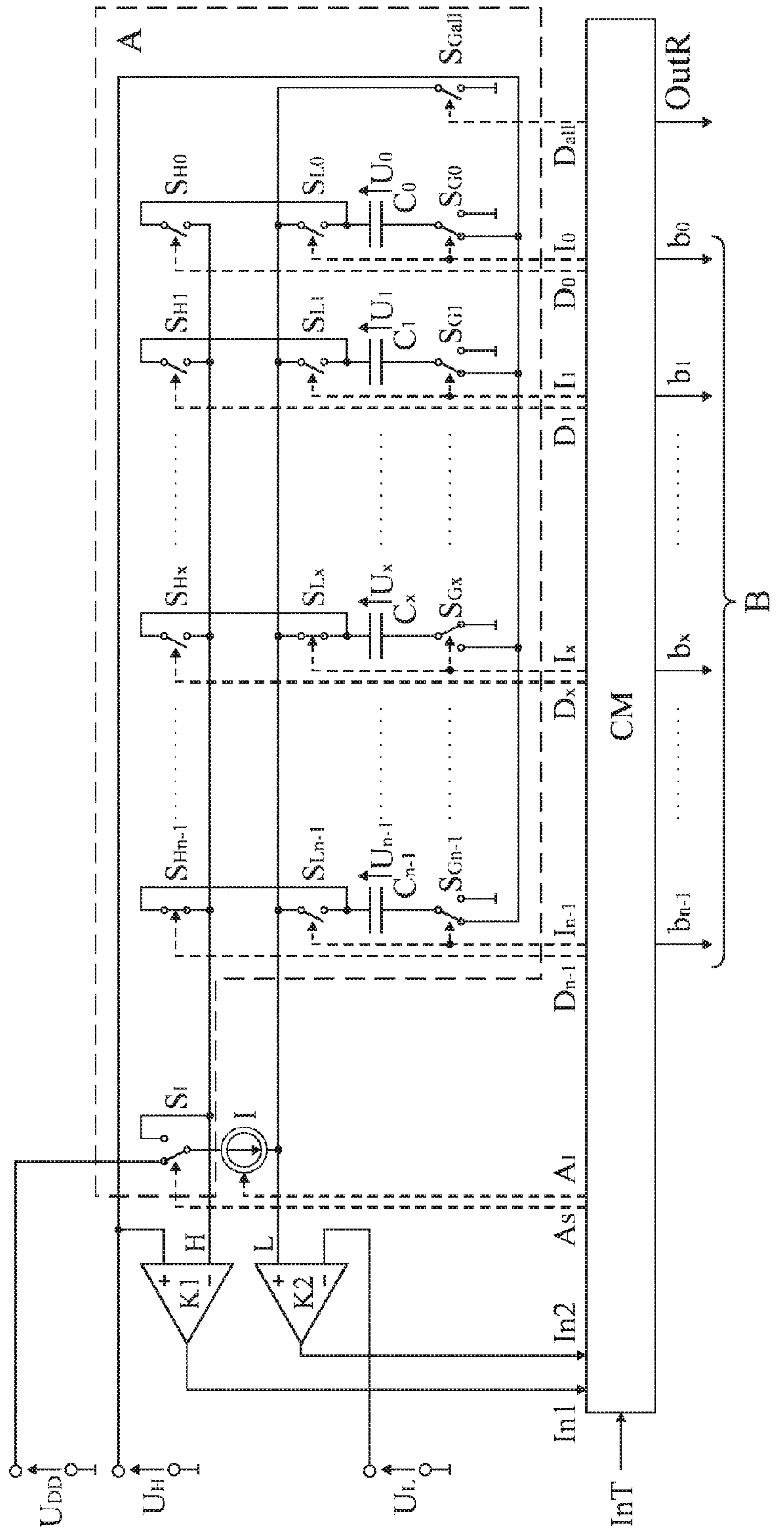

FIG. 4—illustrates the schematic diagram of the apparatus during the accumulation of charge in the subsequent capacitor $C_x$ in the array of capacitors.

Figure 5:
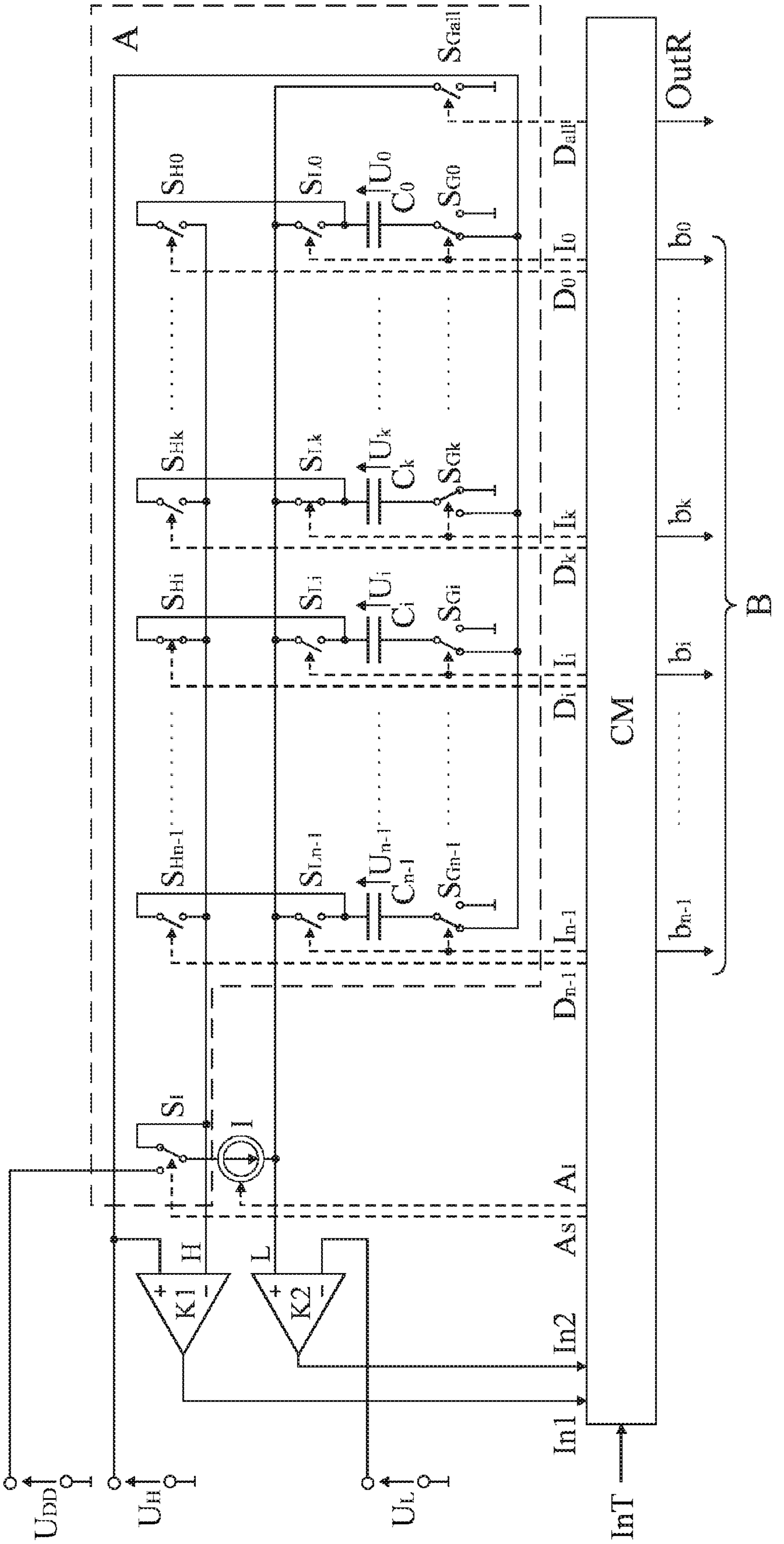

FIG. 5—illustrates the schematic diagram of the apparatus during the transfer of charge from the source capacitor $C_i$ to the destination capacitor $C_k$ in the array of capacitors.

Figure 6:
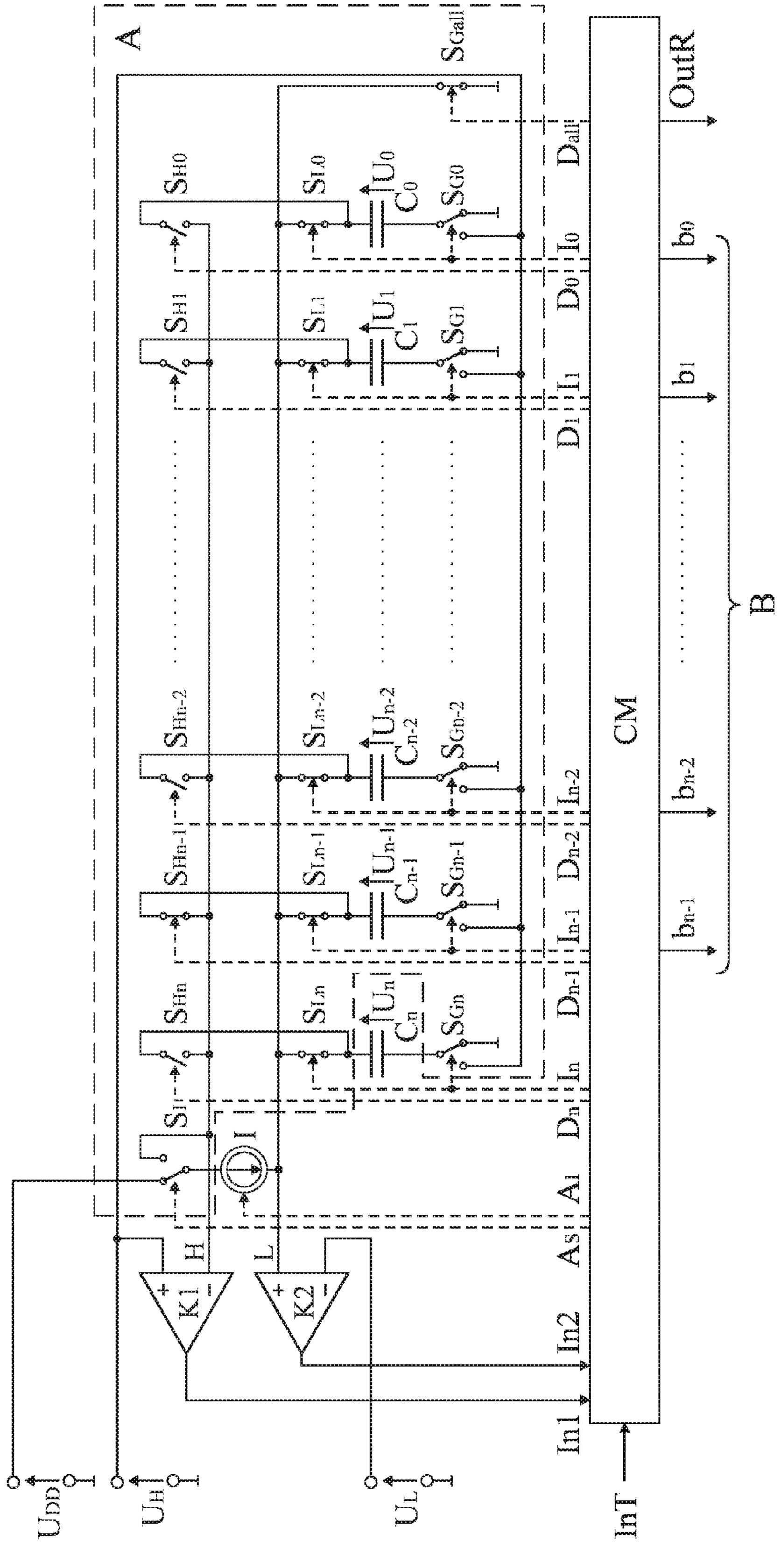

FIG. 6—illustrates the schematic diagram of the another version of the apparatus in the relaxation phase.

Figure 7:
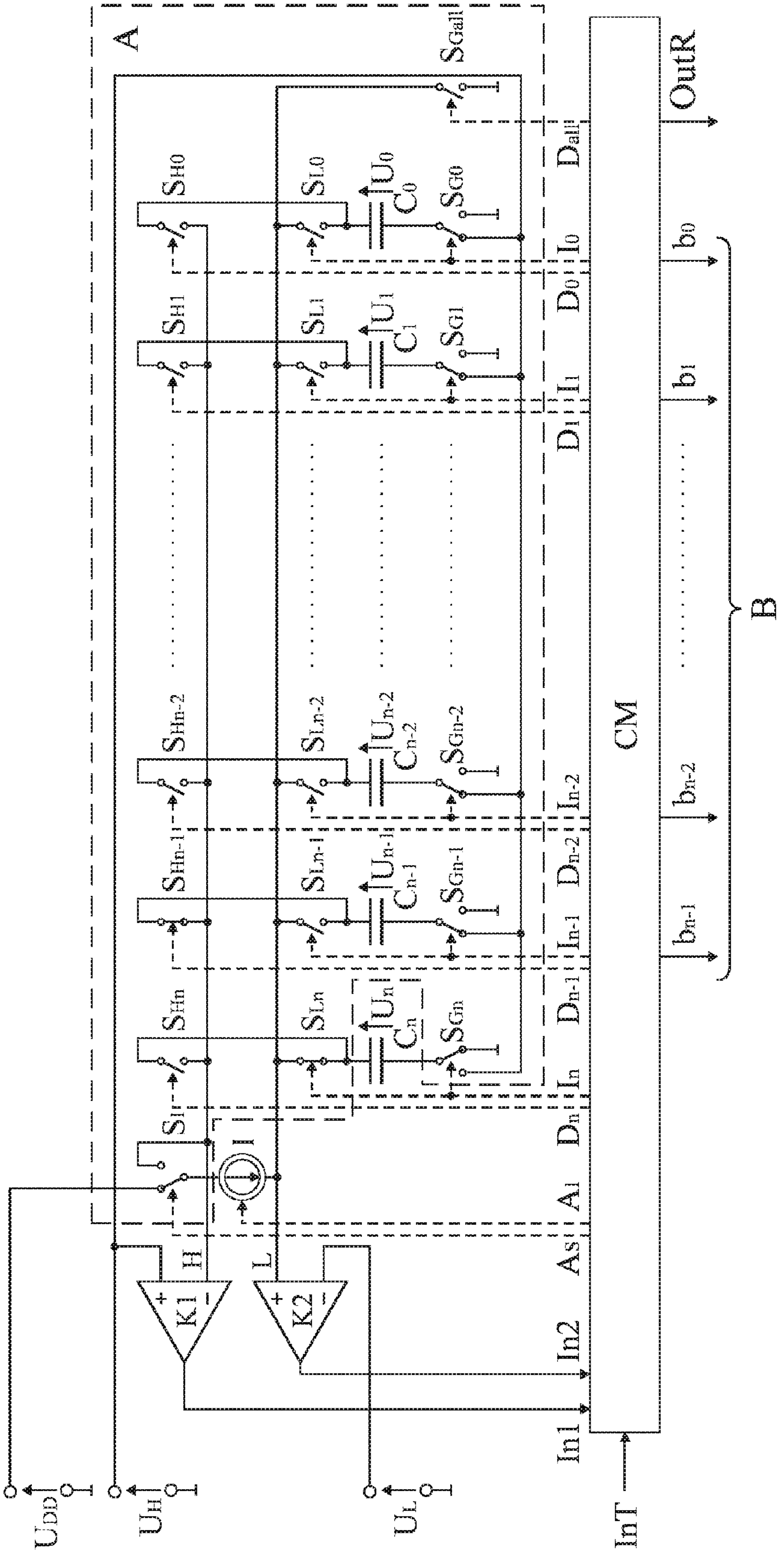

FIG. 7—illustrates the schematic diagram of the another version of the apparatus at time of starting the charge accumulation in the sampling capacitor $C_n$.

Figure 8:
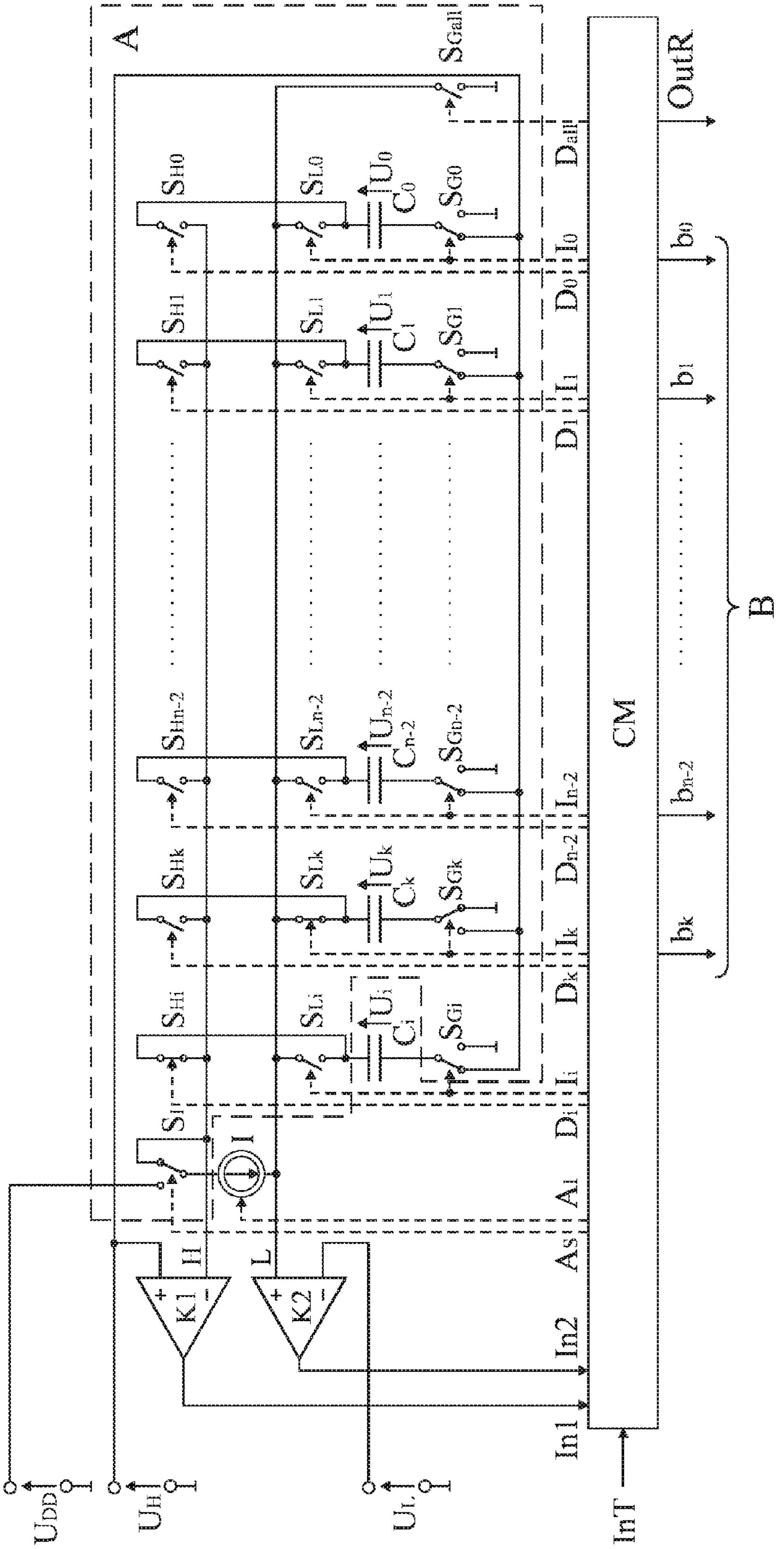

FIG. 8—illustrates the schematic diagram of the another version of the apparatus at time of starting the charge transfer from the source capacitor $C_i$ to the destination capacitor $C_k$ for i=n and k=n−1.

Figure 9:
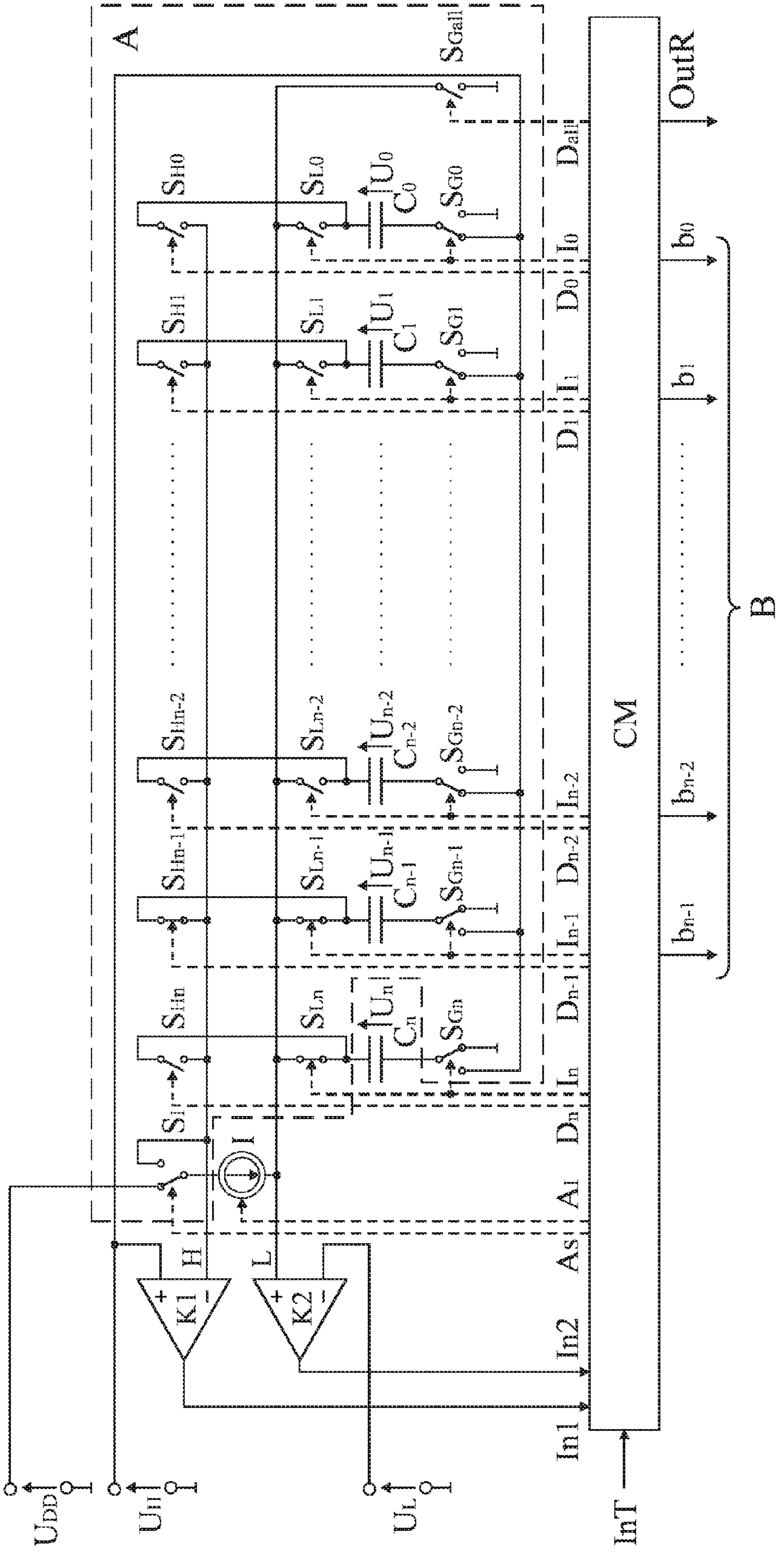

FIG. 9—illustrates the schematic diagram of the another version of the apparatus at time of starting the charge accumulation both in the sampling capacitor $C_n$ and in the capacitor $C_{n-1}$ connected in parallel.

Figure 10:
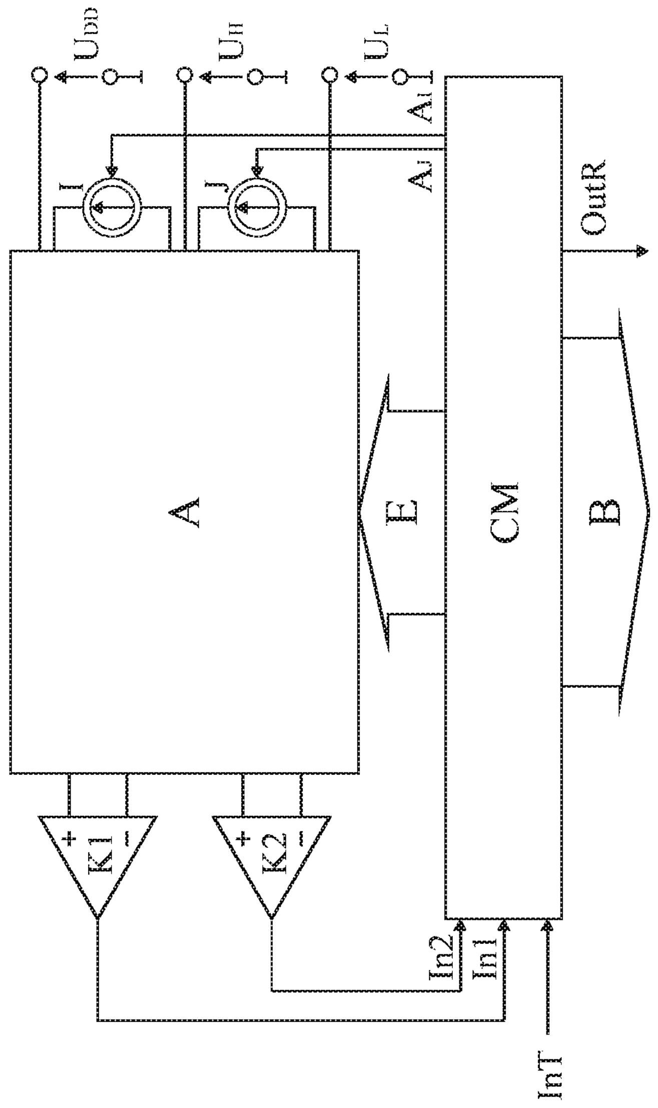

FIG. 10—illustrates a block diagram of the another variant of the apparatus.

Figure 11:
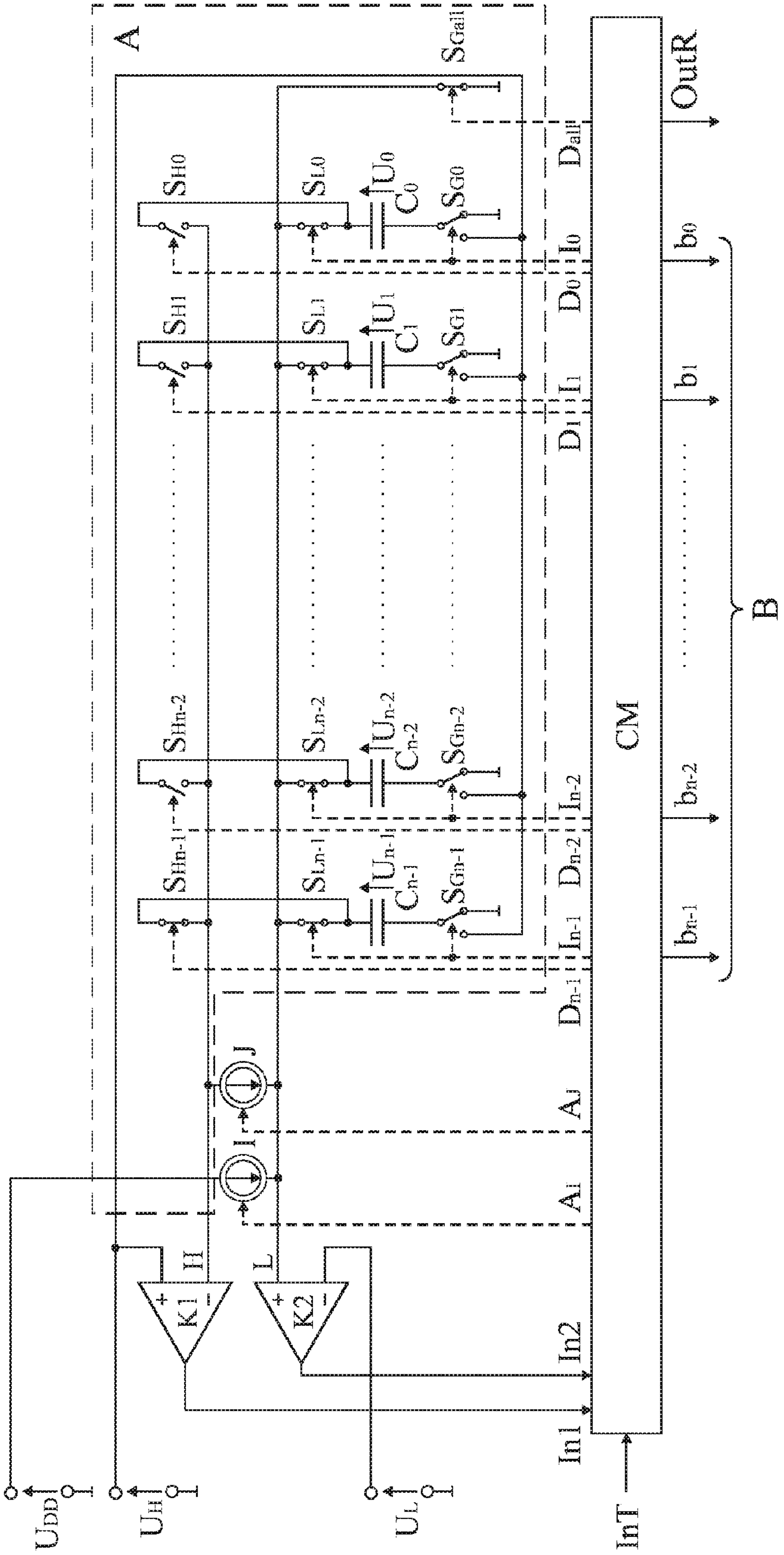

FIG. 11—illustrates the schematic diagram of the another variant of the apparatus in the relaxation phase.

Figure 12:
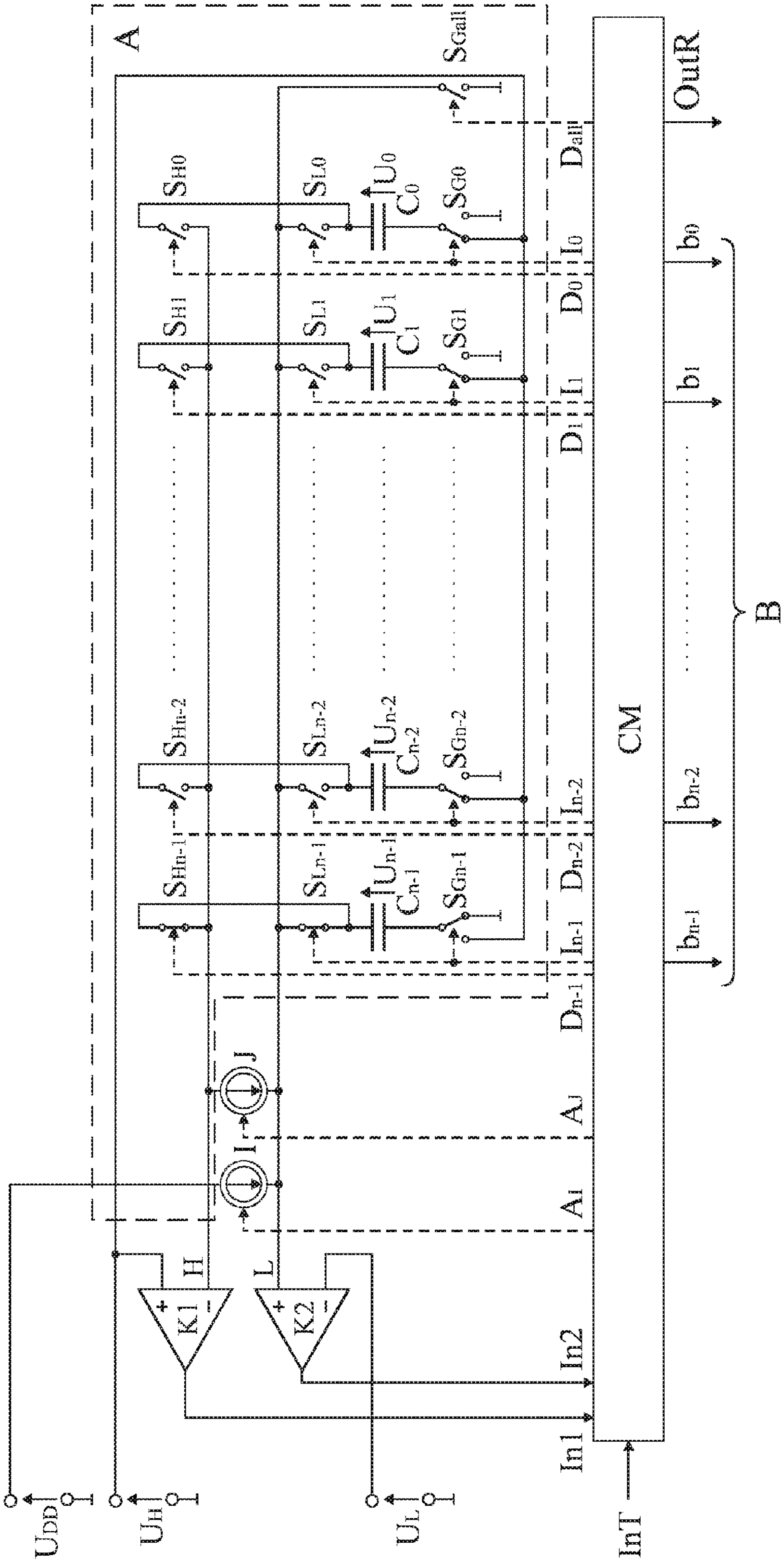

FIG. 12—illustrates the schematic diagram of the another variant of the apparatus after detecting the start of the time interval at time of starting the charge accumulation in the capacitor $C_{n-1}$ in the array of capacitors.

Figure 13:
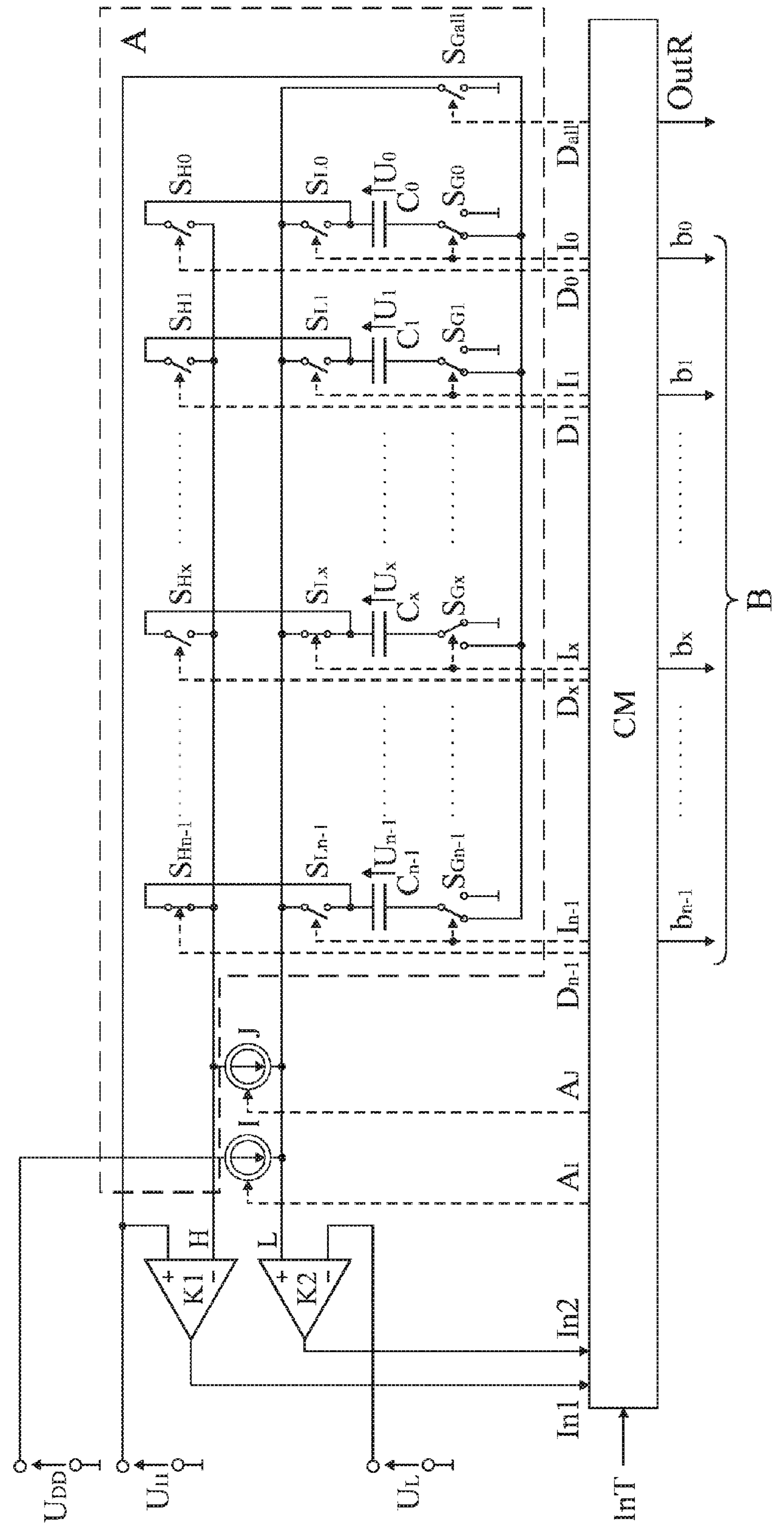

FIG. 13—illustrates the schematic diagram of the another variant of the apparatus during the accumulation of charge in the subsequent capacitor $C_x$ in the array of capacitors.

Figure 14:
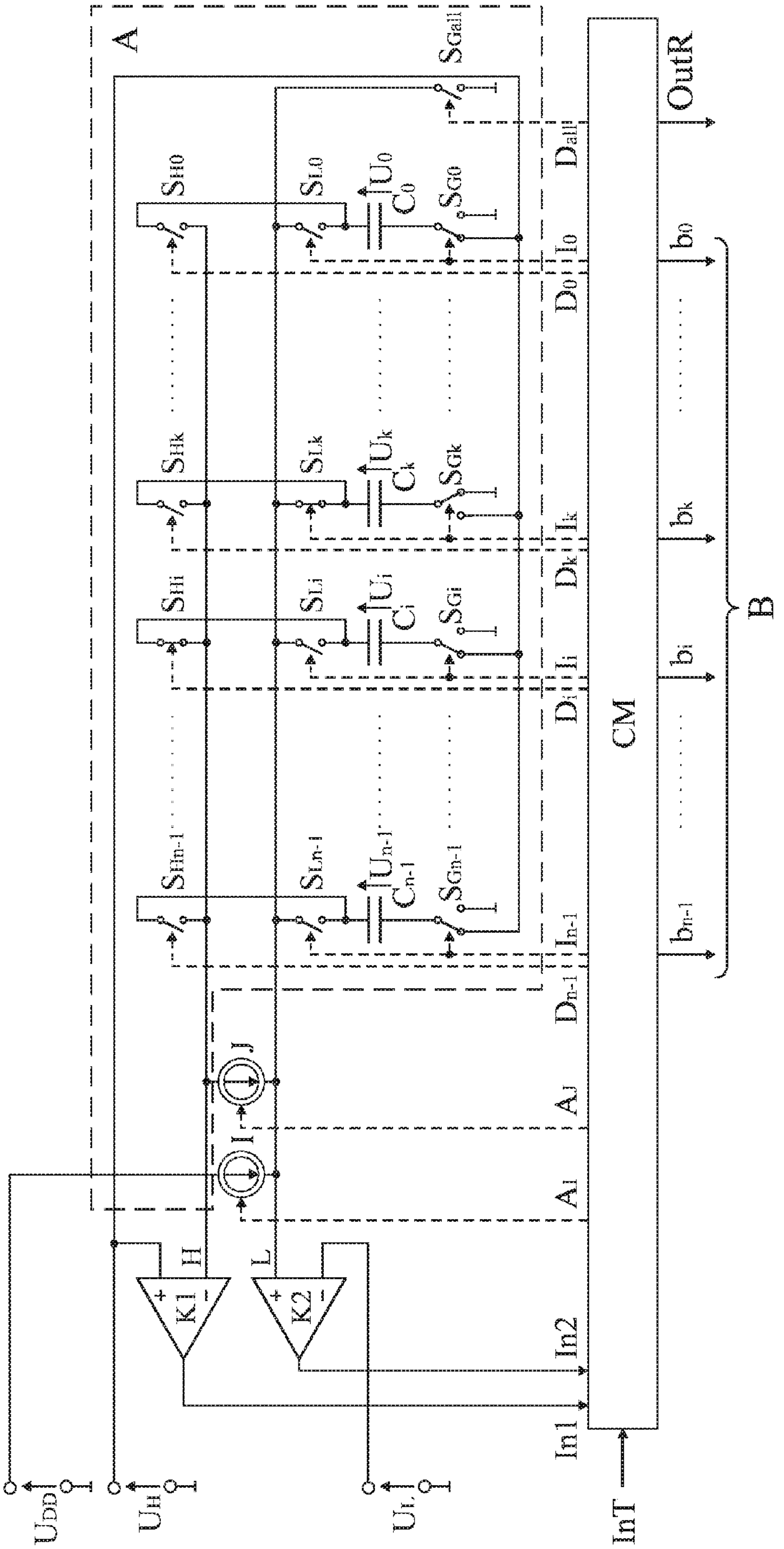

FIG. 14—illustrates the schematic diagram of the another variant of the apparatus during the transfer of charge from the source capacitor $C_i$ to the destination capacitor $C_k$.

Figure 15:
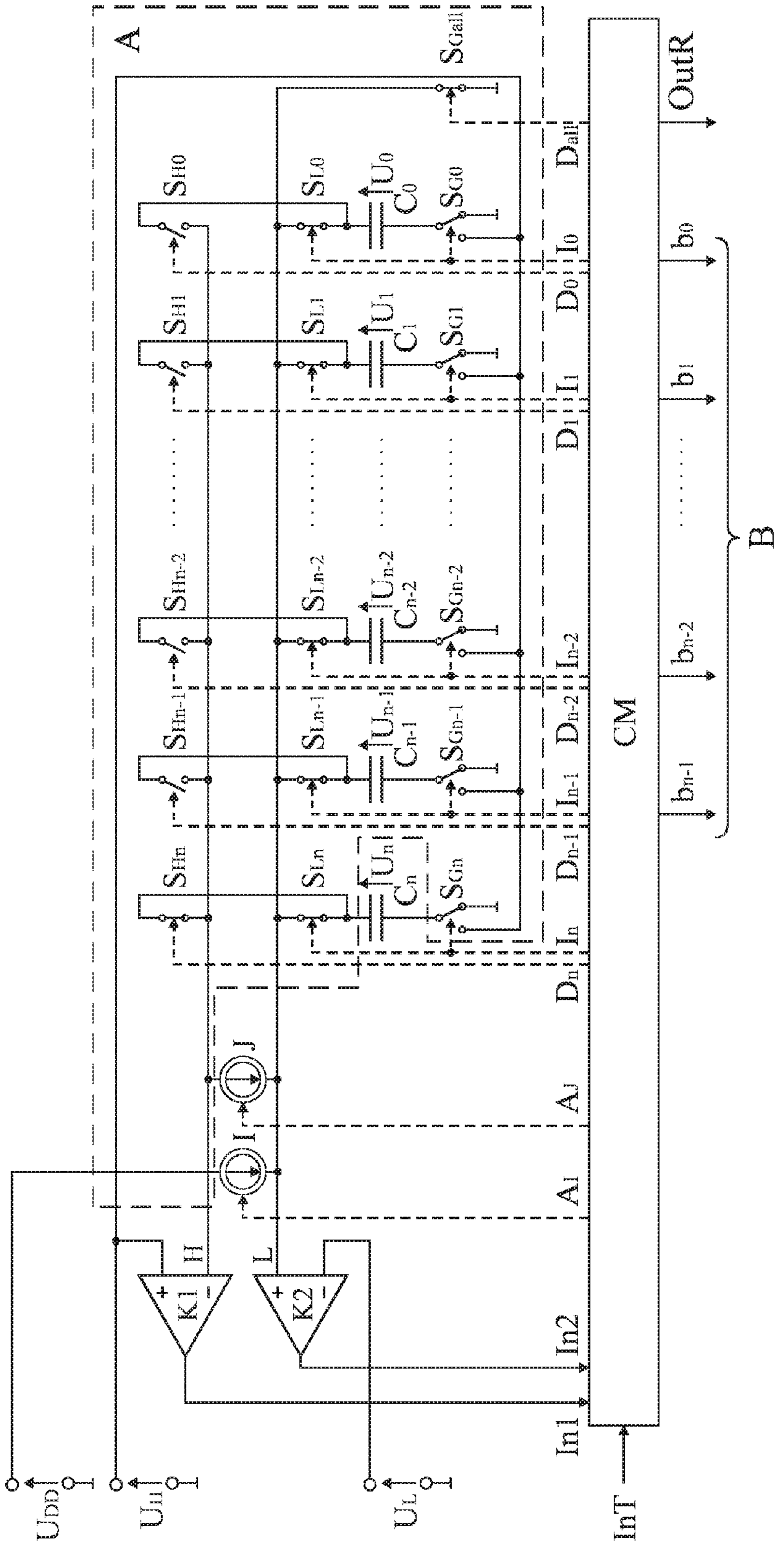

FIG. 15—illustrates the schematic diagram of the another version of the apparatus variant in the relaxation phase.

Figure 16:
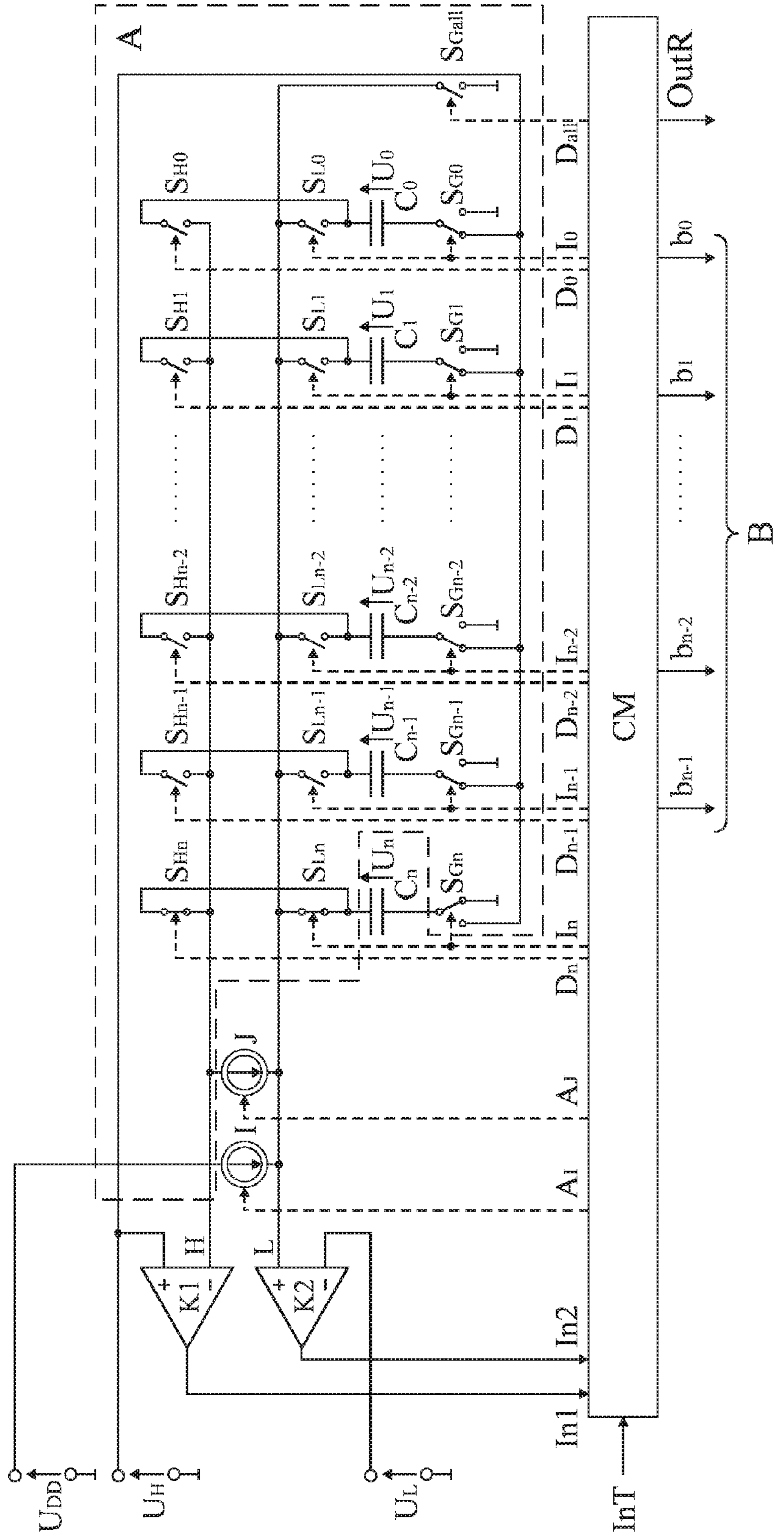

FIG. 16—illustrates the schematic diagram of the another version of the apparatus variant at time of starting the charge accumulation in the sampling capacitor $C_n$.

Figure 17:
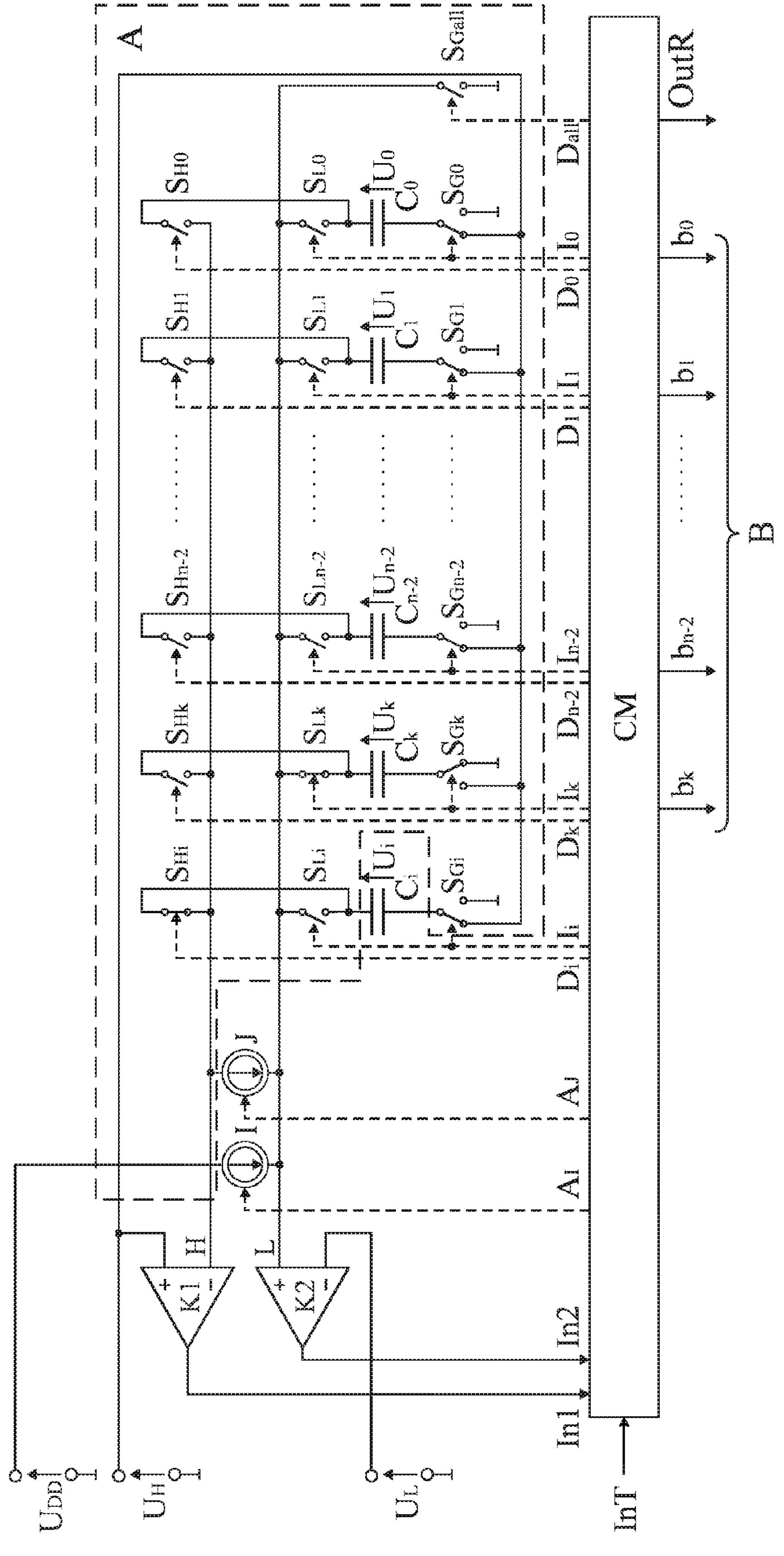

FIG. 17—illustrates the schematic diagram of the another version of the apparatus variant at time of starting the charge transfer from the source capacitor $C_i$ to the destination capacitor $C_k$ for i=n and k=n−1.

Figure 18:
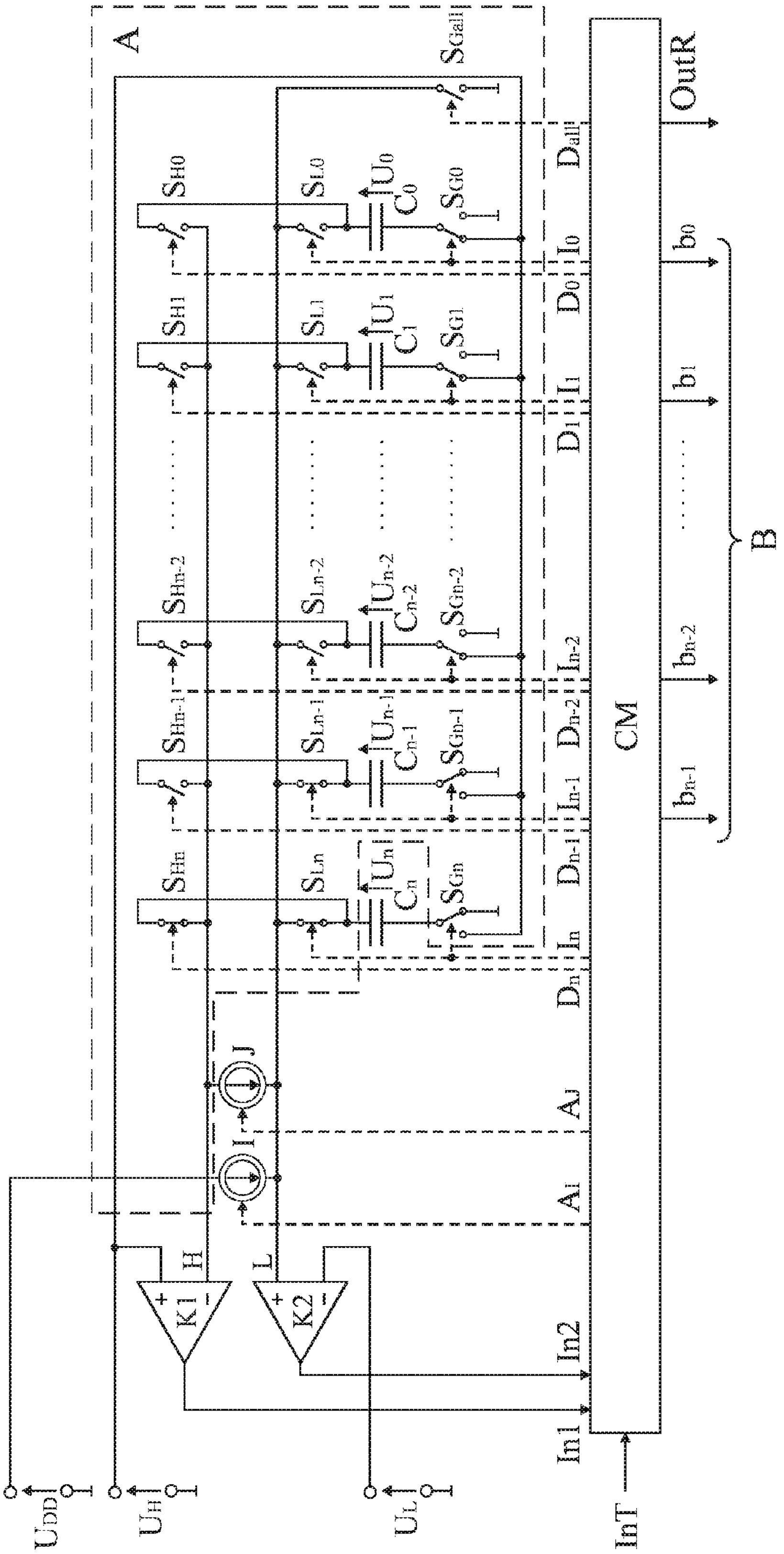

FIG. 18—illustrates the schematic diagram of the another version of the apparatus variant at time of starting the charge accumulation both in the sampling capacitor $C_n$ and in the capacitor $C_{n-1}$ connected in parallel.

The method according to the invention consists in that the time interval, whose both start and whose end are detected by the use of the control module CM, is mapped to a portion of electric charge proportional to the time interval, while the portion of electric charge is delivered during the time interval by the use of current source I and accumulated in an array A of capacitors $C_{n-1}$, $C_{n-2}$, . . . , $C_1$, $C_0$, whereas a capacitance value of a capacitor of a given index is twice as high as a capacitance value of the capacitor of the previous index. Charge accumulation is started from the capacitor $C_{n-1}$ having the highest capacitance value in the array A of capacitors and is realized from the start of the time interval to the end of the time interval detected by means of the control module CM or until the voltage $U_{n-1}$, which increases on the capacitor $C_{n-1}$ and is simultaneously observed by the use of the second comparator K2, equals the reference voltage $U_L$ value, and in this case the charge accumulation is continued in the subsequent capacitor in the array A of capacitors whose capacitance value is twice lower than the capacitance value of the capacitor in which charge was accumulated directly before, and at the same time the voltage, increasing on the capacitor in which charge is accumulated currently, is compared to the reference voltage $U_L$ value by the use of the second comparator K2. The cycle is repeated until the end of the time interval is detected by means of the control module CM, and afterwards, the function of the source capacitor $C_i$, whose index is defined by the content of the source capacitor $C_i$ index register in the control module CM, is assigned by means of the control module CM to the capacitor $C_x$ in the array A of capacitors by writing the value of the index of the capacitor $C_x$ to the source capacitor $C_i$ index register where the capacitor $C_x$ is the last capacitor in which charge was accumulated, and the function of the destination capacitor $C_k$ whose index is defined by the content of the destination capacitor $C_k$ index register in the control module CM is assigned by means of the control module CM to the subsequent capacitor in the array A whose capacitance value is twice lower than the capacitance value of the source capacitor $C_i$ by writing the value stored in the source capacitor $C_i$ index register reduced by one to the destination capacitor $C_k$ index register. Then, the charge accumulated in the source capacitor $C_i$ is transferred to the destination capacitor $C_k$ by the use of the current source I and at the same time the voltage $U_k$ increasing on the destination capacitor $C_k$ is compared to the reference voltage $U_L$ value by the use the second comparator K2, and also the voltage $U_i$ on the source capacitor $C_i$ is observed by the use of the first comparator K1. When the voltage $U_i$ on the source capacitor $C_i$ observed by the use of the first comparator K1 equals zero during the charge transfer, the function of the source capacitor $C_i$ is assigned to the current destination capacitor $C_k$ by means of the control module CM on the basis of the output signal of the first comparator K1 by writing the current content of the destination capacitor $C_k$ index register in the control module CM to the source capacitor $C_i$ index register in the control module CM, and also the function of the destination capacitor $C_k$ is assigned to the subsequent capacitor in the array A whose capacitance value is twice lower than the capacitance value of the capacitor that operated as the destination capacitor directly before by reducing the content of the destination capacitor $C_k$ index register by one, and charge transfer from a new source capacitor $C_i$ to a new destination capacitor $C_k$ is continued by the use of the current source I. On the other hand, when the voltage $U_k$ on the destination capacitor $C_k$ observed by the use of the second comparator K2 equals the reference voltage $U_L$ value during the transfer of charge from the source capacitor $C_i$ to the destination capacitor $C_k$, the function of the destination capacitor $C_k$ is assigned by means of the control module CM on the basis of the output signal of the second comparator K2 to the subsequent capacitor in the array A whose capacitance value is twice lower than the capacitance value of the capacitor that operated as the destination capacitor directly before by reducing the content of the destination capacitor $C_k$ index register by one, and also the charge transfer from the source capacitor $C_i$ to a new destination capacitor $C_k$ is continued. This process is still controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$ increasing on the capacitor $C_0$ and observed at the same time by the use of the second comparator K2 equals the reference voltage $U_L$ value while the value one is assigned to these bits $b_{n-1}, b_{n-2}, \ldots, b_1, b_0$ in the digital word corresponding to the capacitors $C_{n-1}$, $C_{n-2}, \ldots, C_1, C_0$ in the array A of capacitors on which the voltage equal to the reference voltage $U_L$ value has been obtained, and the value zero is assigned to the other bits by means of the control module CM.

In the another variant of the method, electric charge is delivered by the use of the current source I and accumulated in the sampling capacitor $C_n$ during the time interval, whose both start and end are detected by means of the control module CM, and after detecting the end of the time interval by means of the control module CM, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register, and also the function of the destination capacitor $C_k$ whose index is defined by the content of the destination capacitor $C_k$ index register in the control module CM is assigned by means of the control module CM to the capacitor $C_{n-1}$ having the highest capacitance value in the array A of capacitors by writing the value of the index of the capacitor $C_{n-1}$ to the destination capacitor $C_k$ index register. Next, the process of electric charge transfer from the source capacitor $C_i$ to the destination capacitor $C_k$ is realized by the use of the current source I. This process is controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, electric charge is delivered by the use of the current source I and is accumulated during the time interval whose both start and end are detected by means of the control module CM in the capacitor $C_{n-1}$ having the highest capacitance value in the array A of capacitors and at the same time in the sampling capacitor $C_n$ connected in parallel to the capacitor $C_{n-1}$ in the array A of capacitors where the capacitance value of the sampling capacitor $C_n$ is not smaller than the capacitance value of the capacitor $C_{n-1}$. After detecting the end of the time interval by means of the control module CM, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register, and also the function of the destination capacitor $C_k$ whose index is defined by the content of the destination capacitor $C_k$ index register in the control module CM is assigned by means of the control module CM to the capacitor $C_{n-1}$ in the array A of capacitors by writing the value of the index of the capacitor $C_{n-1}$ in the array A of capacitors to the destination capacitor $C_k$ index register. After that, the process of the charge transfer from the source capacitor $C_i$ to the destination capacitor $C_k$ is realized by the use of the current source I. This process is controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, after detecting the end of the time interval by means of the control module CM and after writing the values of indexes of relevant capacitors to the source capacitor $C_i$ index register and to the destination capacitor $C_k$ index register by means of the control module CM, the process of charge redistribution is realized during which charge is transferred from the source capacitor $C_i$ to the destination capacitor $C_k$ by the use of the additional current source J whose effectiveness is different from the effectiveness of the current source I while it is preferred to use the additional current source J whose effectiveness is higher than the effectiveness of the current source I. The process of charge redistribution is controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, electric charge is delivered by the use of the current source I and is accumulated in the sampling capacitor $C_n$ during the time interval whose both start and end are detected by means of the control module CM. After detecting the end of the time interval by means of the control module CM, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register, and also the function of the destination capacitor $C_k$ whose index is defined by the content of the destination capacitor $C_k$ index register in the control module CM is assigned by means of the control module CM to the capacitor $C_{n-1}$ having the highest capacitance value in the array A of capacitors by writing the value of the index of the capacitor $C_{n-1}$ to the destination capacitor index register. After that, the process of redistribution of accumulated electric charge is realized during which charge is transferred from the source capacitor $C_i$ to the destination capacitor $C_k$ by the use of the additional current source J whose effectiveness is different from the effectiveness of the current source I while it is preferred to use the additional current source J whose effectiveness is higher than the effectiveness of the current source I. This process is controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, electric charge is delivered by the use of the current source I and is accumulated during the time interval whose both start and end are detected by means of the control module CM in the capacitor $C_{n-1}$ having the highest capacitance value in the array A of capacitors and at the same time in the sampling capacitor $C_n$ connected in parallel to the capacitor $C_{n-1}$ in the array A of capacitors where the capacitance value of the sampling capacitor $C_n$ is not smaller than the capacitance value of the capacitor $C_{n-1}$. After detecting the end of the time interval by means of the control module CM, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register, and also the function of the destination capacitor $C_k$ whose index is defined by the content of the destination capacitor $C_k$ index register in the control module CM is assigned by means of the control module CM to the capacitor $C_{n-1}$ in the array A of capacitors by writing the value of the index of the capacitor $C_{n-1}$ in the array A of capacitors to the destination capacitor $C_k$ index register. After that, the process of redistribution of accumulated charge is realized during which charge is transferred from the source capacitor $C_i$ to the destination capacitor $C_k$ by the use of the additional current source J whose effectiveness is different from the effectiveness of the current source I while it is preferred to use the additional current source J whose effectiveness is higher than the effectiveness of the current source I. This process is controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

The apparatus according to the invention comprises the array A of capacitors whose control inputs are connected to the set of control outputs E of the control module CM, and the control module CM is equipped with the digital output B, the complete conversion signal output OutR, the time interval signal input InT and two control inputs In1 and In2. The first control input In1 is connected to the output of the first comparator K1 whose inputs are connected to one pair of outputs of the array A of capacitors, and the other control input In2 of the control module CM is connected to the output of the second comparator K2 whose inputs are connected to the other pair of outputs of the array A. Furthermore, the voltage supply $U_{DD}$, the source of auxiliary voltage $U_H$ together with the source of the reference voltage $U_L$ and the controlled current source I are connected to the array A of capacitors, and the control input of the controlled current source I is connected to the control output $A_I$ of the control module CM.

The array A in this variant of the apparatus comprises a number of n capacitors $C_{n-1}, C_{n-2}, \ldots, C_1, C_0$, and a capacitance value of a capacitor of a given index is twice as high as a capacitance value of the capacitor of the previous index, while a relevant bit $b_{n-1}, b_{n-2}, \ldots, b_1, b_0$ in the digital output B of the control module CM is assigned to each capacitor $C_{n-1}, C_{n-2}, \ldots, C_1, C_0$. The top plate of the capacitor $C_{n-1}$ having the highest capacitance value in the array A of capacitors is connected through the closed first on-off switch $S_{Ln-1}$ to the first rail L with which the top plates of the other capacitors $C_{n-2}, \ldots, C_1, C_0$ in the array A of capacitors are connected through the open first on-off switches $S_{Ln-2}, \ldots, S_{L1}, S_{L0}$, while the top plate of the capacitor $C_{n-1}$ is also connected through the closed second on-off switch $S_{Hn-1}$ to the second rail H with which the top plates of the other capacitors $C_{n-2}, \ldots, C_1, C_0$ in the array A are connected through the open second on-off switches $S_{Hn-2}, \ldots, S_{H1}, S_{H0}$. The bottom plate of the capacitor $C_{n-1}$ is connected to the ground of the circuit through the change-over switch $S_{Gn-1}$ whose moving contact is connected to its first stationary contact and the other stationary contact of the change-over switch $S_{Gn-1}$ is connected to the source of auxiliary voltage $U_H$ and also to the non-inverting input of the first comparator K1. The bottom plates of the other capacitors $C_{n-2}, \ldots, C_1, C_0$ in the array A are connected to the source of auxiliary voltage $U_H$ through the change-over switches $S_{Gn-2}, \ldots, S_{G1}, S_{G0}$ whose moving contacts are connected to their other stationary contacts, and the first stationary contacts of the change-over switches $S_{Gn-2}, \ldots, S_{G1}, S_{G0}$ are connected to the ground of the circuit. On the other hand, the first rail L is connected to the ground of the circuit through the open first rail on-off switch $S_{Gall}$ and to the non-inverting input of the second comparator K2 whose inverting input is connected to the source of the reference voltage $U_L$, while the second rail H is connected to the inverting input of the first comparator K1. Moreover, the control inputs of the first on-off switches $S_{Ln-1}, S_{Ln-2}, \ldots, S_{L1}, S_{L0}$ and the control inputs of the change-over switches $S_{Gn-1}, S_{Gn-2}, \ldots, S_{G1}, S_{G0}$ in the array A are coupled together and connected to the relevant control outputs $I_{n-1}, I_{n-2}, \ldots, I_1, I_0$ of the set of control outputs E of the control module CM, while the control inputs of the second on-off switches $S_{Hn-1}, S_{Hn-2}, \ldots, S_{H1}, S_{H0}$ and the control input of the first rail on-off switch $S_{Gall}$ are connected to the relevant control outputs $D_{n-1}, D_{n-2}, \ldots, D_1, D_0$ and $D_{all}$ of the set of control outputs E of the control module CM. Furthermore, one end of the current source I is connected to the voltage supply $U_{DD}$ through the current source change-over switch $S_I$ whose moving contact is connected to its first stationary contact, and the other stationary contact of the current source change-over switch $S_I$ is connected to the second rail H, and the other end of the current source I is connected to the first rail L, and furthermore, the control input of the current source I is connected to the control output $A_I$ of the control module CM, and the control input of the current source change-over switch $S_I$ is connected to the control output $A_S$ of the control module CM.

In the another version of this apparatus variant, the sampling capacitor $C_n$ is connected to the array A of capacitors, while the top plate of the sampling capacitor $C_n$ is connected to the first rail L through the closed first on-off switch $S_{Ln}$ and also it is connected to the second rail H through the open second on-off switch $S_{Hn}$. The bottom plate of the sampling capacitor $C_n$ is connected to the ground of the circuit through the change-over switch $S_{Gn}$ whose moving contact is connected to its first stationary contact, and the other stationary contact of the change-over switch $S_{Gn}$ is connected to the source of auxiliary voltage $U_H$, and the control input of the first on-off switch $S_{Ln}$ and the control input of the change-over switch $S_{Gn}$ are coupled together and connected to the control output $I_n$ of the control module CM, whereas the control input of the second on-off switch $S_{Hn}$ is connected to the control output $D_n$ of the control module CM. Furthermore, the top plate of the capacitor $C_{n-1}$ having the highest capacitance value in the array A of capacitors is connected to the first rail L through the open first on-off switch $S_{Ln-1}$ and to the second rail H through the closed second on-off switch $S_{Hn-1}$, while the bottom plate of the capacitor $C_{n-1}$ is connected to the source of auxiliary voltage $U_H$ through the change-over switch $S_{Gn-1}$ whose moving contact is connected to its other stationary contact, whereas the first stationary contact of the change-over switch $S_{Gn-1}$ is connected to the ground of the circuit.

In the another version of this apparatus variant, the sampling capacitor $C_n$ is connected to the array A of capacitors where the capacitance value of the sampling capacitor $C_n$ is not smaller than the capacitance value of the capacitor $C_{n-1}$ having the highest capacitance value in the array A of capacitors, while the sampling capacitor $C_n$ is connected in parallel to the capacitor $C_{n-1}$ in the array A of capacitors through the first rail L and through the ground of the circuit in a way that the top plate of the sampling capacitor $C_n$ is connected to the first rail L through the closed first on-off switch $S_{Ln}$, and on the other hand, the bottom plate of the sampling capacitor $C_n$ is connected to the ground of the circuit through the change-over switch $S_{Gn}$ whose moving contact is connected to its first stationary contact, and the other stationary contact of the change-over switch $S_{Gn}$ is connected to the source of auxiliary voltage $U_H$. Moreover, the top plate of the sampling capacitor $C_n$ is connected also to the second rail H through the open second on-off switch $S_{Hn}$, whereas the control input of the first on-off switch $S_{Ln}$ and the control input of the change-over switch $S_{Gn}$ are coupled together and connected to the control output $I_n$ of the control module CM, and the control input of the second on-off switch $S_{Hn}$ is connected to the control output $D_n$ of the control module CM.

In the another variant of the apparatus, a controlled additional current source J is connected to the array A of capacitors whereas the effectiveness of the additional current source J is different from the effectiveness of the current source I while it is preferred to use the additional current source J whose effectiveness is higher than the effectiveness of the current source I, and the control input of the additional current source J is connected to the control output $A_J$ of the control module CM.

The array A of capacitors in this variant of the apparatus comprises a number of n capacitors $C_{n-1}, C_{n-2}, \ldots, C_1, C_0$, and a capacitance value of a capacitor of a given index is twice as high as a capacitance value of the capacitor of the previous index, while a relevant bit $b_{n-1}, b_{n-2}, \ldots, b_1, b_0$ in the digital output B of the control module CM is assigned to each capacitor $C_{n-1}, C_{n-2}, \ldots, C_1, C_0$. The top plate of the capacitor $C_{n-1}$ having the highest capacitance value in the array A of capacitors is connected through the closed first on-off switch $S_{Ln-1}$ to the first rail L with which the top plates of the other capacitors $C_{n-2}, \ldots, C_1, C_0$ in the array A of capacitors are connected through the open first on-off switches $S_{Ln-2}, \ldots, S_{L1}, S_{L0}$, while the top plate of the capacitor $C_{n-1}$ is also connected through the closed second on-off switch $S_{Hn-1}$ to the second rail H with which the top plates of the other capacitors $C_{n-2}, \ldots, C_1, C_0$ in the array A are connected through the open second on-off switches $S_{Hn-2}, \ldots, S_{H1}, S_{H0}$. The bottom plate of the capacitor $C_{n-1}$ is connected to the ground of the circuit through the change-over switch $S_{Gn-1}$ whose moving contact is connected to its first stationary contact and the other stationary contact of the change-over switch $S_{Gn-1}$ is connected to the source of auxiliary voltage $U_H$ and also to the non-inverting input of the first comparator K1. The bottom plates of the other capacitors $C_{n-2}, \ldots, C_1, C_0$ in the array A are connected to the source of auxiliary voltage $U_H$ through the change-over switches $S_{Gn-2}, \ldots, S_{G1}, S_{G0}$ whose moving contacts are connected to their other stationary contacts, and the first stationary contacts of the change-over switches $S_{Gn-2}, \ldots, S_{G1}, S_{G0}$ are connected to the ground of the circuit. On the other hand, the first rail L is connected to the ground of the circuit through the open first rail on-off switch $S_{Gall}$ and to the non-inverting input of the second comparator K2 whose inverting input is connected to the source of the reference voltage $U_L$, while the second rail H is connected to the inverting input of the first comparator K1. Moreover, the control inputs of the first on-off switches $S_{Ln-1}, S_{Ln-2}, \ldots, S_{L1}, S_{L0}$ and the control inputs of the change-over switches $S_{Gn-1}, S_{Gn-2}, \ldots, S_{G1}, S_{G0}$ in the array A are coupled together and connected to the relevant control outputs $I_{n-1}, I_{n-2}, \ldots, I_1, I_0$ of the set of control outputs E of the control module CM, while the control inputs of the second on-off switches $S_{Hn-1}, S_{Hn-2}, \ldots, S_{H1}, S_{H0}$ and the control input of the first rail on-off switch $S_{Gall}$ are connected to the relevant control outputs $D_{n-1}, D_{n-2}, \ldots, D_1, D_0$ and $D_{all}$ of the set of control outputs E of the control module CM. Furthermore, one end of the current source I is connected to the voltage supply $U_{DD}$, and the other end of the current source I is connected to the first rail L with which also the other end of the additional current source J is connected, whereas one end of the additional current source J is connected to the second rail H, and the control input of the current source I is connected to the control output $A_I$ of the control module CM while the control input of the additional current source J is connected to the control output $A_J$ of the control module CM.

In the another version of this apparatus variant, the sampling capacitor $C_n$ is connected to the array A of capacitors, while the top plate of the sampling capacitor $C_n$ is connected to the first rail L through the closed first on-off switch $S_{Ln}$ and also it is connected to the second rail H through the closed second on-off switch $S_{Hn}$. The bottom plate of the sampling capacitor $C_n$ is connected to the ground of the circuit through the change-over switch $S_{Gn}$ whose moving contact is connected to its first stationary contact, and the other stationary contact of the change-over switch $S_{Gn}$ is connected to the source of auxiliary voltage $U_H$, and the control input of the first on-off switch $S_{Ln}$ and the control input of the change-over switch $S_{Gn}$ are coupled together and connected to the control output $I_n$ of the control module CM, whereas the control input of the second on-off switch $S_{Hn}$ is connected to the control output $D_n$ of the control module CM. On the other hand, the top plate of the capacitor $C_{n-1}$ having the highest capacitance value in the array A of capacitors is connected to the first rail L through the open first on-off switch $S_{Ln-1}$ and to the second rail H through the open second on-off switch $S_{Hn-1}$, while the bottom plate of the capacitor $C_{n-1}$ is connected to the source of auxiliary voltage $U_H$ through the change-over switch $S_{Gn-1}$ whose moving contact is connected to its other stationary contact, whereas the first stationary contact of the change-over switch $S_{Gn-1}$ is connected to the ground of the circuit.

In the another version of this apparatus variant, the sampling capacitor $C_n$ is connected to the array A of capacitors where the capacitance value of the sampling capacitor $C_n$ is not smaller than the capacitance value of the capacitor $C_{n-1}$ having the highest capacitance value in the array A of capacitors, while the sampling capacitor $C_n$ is connected in parallel to the capacitor $C_{n-1}$ in the array A of capacitors through the first rail L and through the ground of the circuit in a way that the top plate of the sampling capacitor $C_n$ is connected to the first rail L through the closed first on-off switch $S_{Ln}$, and on the other hand, the bottom plate of the sampling capacitor $C_n$ is connected to the ground of the circuit through the change-over switch $S_{Gn}$ whose moving contact is connected to its first stationary contact, and the other stationary contact of the change-over switch $S_{Gn}$ is connected to the source of auxiliary voltage $U_H$. Moreover, the top plate of the sampling capacitor $C_n$ is connected also to the second rail H through the closed second on-off switch $S_{Hn}$, whereas the control input of the first on-off switch $S_{Ln}$ and the control input of the change-over switch $S_{Gn}$ are coupled together and connected to the control output $I_n$ of the control module CM, and the control input of the second on-off switch $S_{Hn}$ is connected to the control output $D_n$ of the control module CM while the top plate of the capacitor $C_{n-1}$ having the highest capacitance value in the array A of capacitors is connected to the first rail L through the closed first on-off switch $S_{Ln-1}$ and also to the second rail H through the open second on-off switch $S_{Hn-1}$, whereas the bottom plate of the capacitor $C_{n-1}$ is connected to the ground of the circuit through the change-over switch $S_{Gn-1}$ whose moving contact is connected to its other stationary contact, whereas the first stationary contact of the change-over switch $S_{Gn-1}$ is connected to the source of auxiliary voltage $U_H$.

The apparatus according to the invention operates as follows. Between successive cycles of conversion of time intervals to digital words having a number of bits equal to n, the control module CM keeps the apparatus in the state of relaxation during which the control module CM causes, by means of the control signals provided on the outputs $I_{n-1}, I_{n-2}, \ldots, I_1, I_0$, the closure of the first on-off switches $S_{Ln-1}, S_{Ln-2}, \ldots, S_{L1}, S_{L0}$ and thereby the connection of the top plates of all the capacitors $C_{n-1}, C_{n-2}, \ldots, C_1, C_0$ in the array A to the first rail L and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the ground of the circuit. On the other hand, by means of the control signal provided on the output $D_{all}$, the control module CM causes the closure of the first rail on-off switch $S_{Gall}$ and thereby the connection of the first rail L to the ground of the circuit enforcing in this way a complete discharge of the capacitors $C_{n-1}, C_{n-2}, \ldots, C_1, C_0$ in the array A. Afterwards, the control module CM causes, by means of the control signal provided on the output $D_{n-1}$, the closure of the second on-off switch $S_{Hn-1}$ and thereby the connection of the second rail H to the first rail L and to the ground of the circuit which prevents the occurrence of a random potential on the second rail H. At the same time, the control module CM causes, by means of the control signals provided on the outputs $D_{n-2}, \ldots, D_1, D_0$, the opening of the second on-off switches $S_{Hn-2}, \ldots, S_{H1}, S_{H0}$. Moreover, by means of the control signal provided on the output $A_I$, the control module CM causes the switching off the current source I while, by means of the control signal provided on the output $A_S$, the control module CM causes the switching of the current source change-over switch $S_I$, and thereby the connection of the one end of the current source I to the voltage supply $U_{DD}$ (FIG. 2).

As soon as the control module CM detects the start of the time interval signaled on the time interval signal input InT of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}, \ldots, I_1, I_0$, the opening of the first on-off switches $S_{Ln-2}, \ldots, S_{L1}, S_{L0}$ and thereby the disconnection of the top plates of the capacitors $C_{n-2}, \ldots, C_1, C_0$ in the array A from the first rail L and also the switching of the change-over switches $S_{Gn-2}, \ldots, S_{G1}, S_{G0}$ and thereby the connection of the bottom plates of the capacitors $C_{n-2}, \ldots, C_1, C_0$ to the source of auxiliary voltage $U_H$. At the same time, by means of the control signal provided on the output $A_I$, the control module CM causes the switching on the current source I. At the same time, the control module CM deactivates the signal provided on the complete conversion signal output OutR and assigns the initial value zero to all the bits $b_{n-1}, b_{n-2}, \ldots, b_1, b_0$ in the digital word. At the same time, the control module CM assigns the function of the charge collecting capacitor $C_x$ to the capacitor $C_{n-1}$ having the highest capacitance value in the array A where the index of the charge collecting capacitor $C_x$ is defined by the content of the destination capacitor $C_k$ index register in the control module CM by writing the value of the index of the capacitor $C_{n-1}$ to the destination capacitor $C_k$ index register (FIG. 3). The electric charge delivered by the use of the current source I is accumulated at first in the capacitor $C_{n-1}$ in the array A which is the only capacitor connected at that time to the other end of the current source I through the first rail L and through the closed first on-off switch $S_{Ln-1}$. Accumulation of charge in the capacitor $C_x$ causes a progressive increase of the voltage $U_x$ on that capacitor. The voltage $U_x$ is compared to the reference voltage $U_L$ of a fixed value by the second comparator K2. When the voltage $U_x$ on the capacitor $C_x$, in which the charge is accumulated, reaches the reference voltage $U_L$ value during the converted time interval, the control module CM assigns the value one to the bit $b_x$ of the digital word on the output B of the apparatus on the basis of the output signal of the second comparator K2. At the same time, the control module CM causes, by means of the control signal provided on the output $I_x$, the opening of the first on-off switch $S_{Lx}$ and thereby the disconnection of the top plate of the charged capacitor $C_x$ from the first rail L, and also the concurrent switching of the change-over switch $S_{Gx}$ and thereby the connection of the bottom plate of the capacitor $C_x$ to the source of auxiliary voltage $U_H$. Next, by reduction of the content of the destination capacitor $C_k$ index register by one, the control module CM assigns the function of the charge collecting capacitor $C_x$ to the subsequent capacitor in the array A having the capacitance value twice as lower as the capacitance value of the capacitor which acted as the charge collecting capacitor directly before. Afterwards, the control module CM causes, by means of the control signal provided on the output $I_x$, the closure of the first on-off switch $S_{Lx}$ and thereby the connection of the top plate of the capacitor $C_x$ through the first rail L to the other end of the current source I, and also the concurrent switching of the change-over switch $S_{Gx}$ and thereby the connection of the bottom plate of the capacitor $C_x$ to the ground of the circuit. The electric charge delivered by the use of the current source I is then accumulated in the subsequent capacitor $C_x$ which is the only capacitor connected at that time to the other end of the current source I through the first rail L and through the closed first on-off switch $S_{Lx}$ (FIG. 4). Each time the voltage $U_x$ increasing on the capacitor $C_x$ reaches the reference voltage $U_L$ value during the converted time interval, which is signaled to the control module CM by the second comparator K2, the cycle is repeated again with the subsequent capacitor in the array A having the capacitance value twice as lower as the capacitance value of the capacitor which acted as the charge collecting capacitor directly before.

When the control module CM detects the end of converted time interval signaled on the time interval signal input InT of the apparatus during the accumulation of charge in the capacitor $C_x$, the control module CM causes, by means of the control signal provided on the output $I_x$, the opening of the first on-off switch $S_{Lx}$ and thereby the disconnection of the top plate of the capacitor $C_x$ from the first rail L, and also the concurrent switching of the change-over switch $S_{Gx}$ and thereby the connection of the bottom plate of the capacitor $C_x$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ from the second rail H. At the same time, the control module CM causes, by means of the control signal provided on the output $A_S$, the switching of the current source change-over switch $S_I$, and thereby the connection of the one end of the current source I to the second rail H. Next, by writing the content of the destination capacitor $C_k$ index register to the source capacitor $C_i$ index register in the control module CM, the control module CM assigns the function of the source capacitor $C_i$, whose index is defined by the content of the source capacitor $C_i$ index register, to the capacitor $C_x$ which accumulated charge as the last capacitor. At the same time, the control module CM causes, by means of the control signal provided on the output $D_i$, the closure of the second on-off switch $S_{Hi}$, and thereby the connection of the top plate of the source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A, whose capacitance value is twice as lower as the capacitance value of the source capacitor $C_i$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. The charge accumulated in the source capacitor $C_i$ is transferred by the use of the current source I through the second rail H and through the first rail L to the destination capacitor $C_k$ (FIG. 5) while the voltage $U_i$ on the source capacitor $C_i$ progressively decreases, whereas at the same time the voltage $U_k$ on the destination capacitor $C_k$ progressively increases during the charge transfer.

In case when the voltage $U_k$ on the current destination capacitor $C_k$ reaches the reference voltage $U_L$ value during the charge transfer, the control module CM on the basis of the output signal of the second comparator K2 assigns the value one to the relevant bit $b_k$ in the digital word, and the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Afterwards, by reduction of the content of the destination capacitor $C_k$ index register by one, the control module CM assigns the function of the destination capacitor $C_k$ to the subsequent capacitor in the array A, whose capacitance value is twice as lower as the capacitance value of the capacitor which acted as the destination capacitor directly before. After that, the control module CM causes, by means of the control signal provided on the output $I_k$, the closure of the first on-off switch $S_{Lk}$ and thereby the connection of the top plate of a new destination capacitor $C_k$ to the first rail L, and also the concurrent switching of the change-over switch $S_{Gk}$ and thereby the connection of the bottom plate of the destination capacitor $C_k$ to the ground of the circuit.

In case when the voltage $U_i$ on the source capacitor $C_i$ reaches the value zero during the charge transfer, the control module CM, on the basis of the output signal of the first comparator K1 causes, by means of the control signal provided on the output $D_i$, the opening of the second on-off switch $S_{Hi}$ and thereby the disconnection of the top plate of the source capacitor $C_i$ from the second rail H. At the same time, the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Next, the control module CM, on the basis of the output signal of the first comparator K1 by writing the current content of the destination capacitor $C_k$ index register to the source capacitor $C_i$ index register, assigns the function of the source capacitor $C_i$ to the capacitor that until now has acted as the destination capacitor $C_k$, and after that, the control module CM causes, by means of the control signal provided on the output $D_i$, the closure of the second on-off switch $S_{Hi}$ and thereby the connection of the top plate of a new source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A, whose capacitance value is twice as lower as the capacitance value of the capacitor which acted as the destination capacitor directly before. After that, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the new destination capacitor $C_k$ to the ground of the circuit. In both cases the control module CM continues to control the process of charge transfer on the basis of the output signals of both comparators K1 and K2. Each occurrence of the active state on the output of the second comparator K2 causes the assignment of the function of the destination capacitor $C_k$ to the subsequent capacitor in the array A, whose capacitance value is twice as lower as the capacitance value of the capacitor which acted as the destination capacitor directly before. On the other hand, each occurrence of the active state on the output of the first comparator K1 causes the assignment of the function of the source capacitor $C_i$ to the capacitor that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before.

The process of charge redistribution is terminated when the capacitor $C_0$ having the lowest capacitance value in the array A stops to act as the destination capacitor $C_k$. Such situation occurs when the active state appears on the output of the first comparator K1 or on the output of the second comparator K2 during charge transfer to the capacitor $C_0$. When the active state appears on the output of the second comparator K2, the control module CM assigns the value one to the bit $b_0$.

After termination of redistribution of charge accumulated in the capacitor $C_x$ which is the last capacitor accumulating the charge delivered by the use of the current source I during the converted time interval and after assigning the corresponding values to the bits $b_{n-1}, b_{n-2}, \ldots, b_1, b_0$ in the output digital word, the control module CM activates the signal provided on the complete conversion signal output OutR and causes introduction of the apparatus into the relaxation phase by switching off the current source I, the switching of the current source change-over switch $S_I$, and thereby the connection of the one end of the current source I to the voltage supply $U_{DD}$, also the closure of the first on-off switches $S_{Ln-1}, S_{Ln-2}, \ldots, S_{L1}, S_{L0}$ and thereby the connection of the top plates of all the capacitors $C_{n-1}, C_{n-2}, \ldots, C_1, C_0$ in the array A to the first rail L, and also the concurrent switching of the change-over switches $S_{Gn-1}$, $S_{Gn-2}$, . . . , $S_{G1}$, $S_{G0}$ to positions connecting the bottom plates of the capacitors $C_{n-1}$, $C_{n-2}$, . . . , $C_1$, $C_0$ to the ground of the circuit. At the same time, the control module causes the closure of the first rail on-off switch $S_{Gall}$ and thereby the connection of the first rail L to the ground of the circuit, enforcing a complete discharge of the capacitors $C_{n-1}$, $C_{n-2}$, . . . , $C_1$, $C_0$ in the array A, and also the opening of the second on-off switches $S_{Hn-2}$, . . . , $S_{H1}$, $S_{H0}$ in the array A, the closure of the second on-off switch $S_{Hn-1}$ and thereby the connection of the second rail H to the first rail L and to the ground of the circuit (FIG. 2), which prevents the occurrence of a random potential on the first rail H.

The operation of the another version of this apparatus variant consists in that during the time in which the apparatus is kept in the state of relaxation, the control module CM causes the connection of the top plate of the sampling capacitor $C_n$ and the connection of the top plates of the capacitors $C_{n-1}$, $C_{n-2}$, . . . , $C_1$, $C_0$ in the array A to the first rail L, and the connection of the bottom plate of the sampling capacitor $C_n$ and the connection of the bottom plates of the capacitors $C_{n-1}$, $C_{n-2}$, . . . , $C_1$, $C_0$ to the ground of the circuit through the closure of the relevant on-off switches and the switching of the relevant change-over switches (FIG. 6) enforcing in this way a complete discharge of the sampling capacitor $C_n$ and of the capacitors $C_{n-1}$, $C_{n-2}$ . . . , $C_1$, $C_0$. As soon as the control module CM detects the start of the converted time interval signaled on the time interval signal input InT of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-1}$, $I_{n-2}$, . . . , $I_1$, $I_0$, the opening of the first on-off switches $S_{Ln-1}$, $S_{Ln-2}$, . . . , $S_{L1}$, $S_{L0}$ and thereby the disconnection of the top plates of the capacitors $C_{n-1}$, $C_{n-2}$, . . . , $C_1$, $C_0$ in the array A from the first rail L and also the switching of the change-over switches $S_{Gn-1}$, $S_{Gn-2}$, . . . , $S_{G1}$, $S_{G0}$ and thereby the connection of the bottom plates of the capacitors $C_{n-1}$, $C_{n-2}$, . . . , $C_1$, $C_0$ to the source of auxiliary voltage $U_H$. At the same time, by means of the control signal provided on the output $A_I$, the control module CM causes the switching on the current source I (FIG. 7). At the same time, the control module CM deactivates the signal provided on the complete conversion signal output OutR and assigns the initial value zero to all the bits $b_{n-1}$, $b_{n-2}$, . . . , $b_1$, $b_0$ in the digital word. The electric charge delivered by the use of the current source I is accumulated in the sampling capacitor $C_n$ which is the only capacitor connected during the converted time interval to the other end of the current source I through the first rail L and through the closed first on-off switch $S_{Ln}$. When the control module CM detects the end of the converted time interval signaled on the time interval signal input InT of the apparatus, the control module CM causes, by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ in the array A from the second rail H (FIG. 8). At the same time, the control module CM causes, by means of the control signal provided on the output $A_S$, the switching of the current source change-over switch $S_I$ and thereby the connection of the one end of the current source I to the second rail H. Next, the control module CM assigns the function of the source capacitor $C_i$ to the sampling capacitor $C_n$ by writing the value of the index of the sampling capacitor $C_n$ to the source capacitor $C_i$ index register in the control module CM. Next, the control module CM causes, by means of the control signal provided on the output $D_i$, the closure of the second on-off switch $S_{Hi}$ and thereby the connection of the top plate of the source capacitor $C_i$ to the second rail H. At the same time, the control module CM assigns the function of the destination capacitor $C_k$ to the capacitor $C_{n-1}$ having the highest capacitance value in the array A by writing the value of the index of the capacitor $C_{n-1}$ to the destination capacitor $C_k$ index register in the control module CM. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Next, the control module CM starts to control the process of redistribution of accumulated charge. This process is terminated when the capacitor $C_0$ having the lowest capacitance value in the array A stops to act as the destination capacitor $C_k$. After that, the control module CM activates the signal provided on the complete conversion signal output OutR, and causes introducing the apparatus into the relaxation phase again.

The operation of the another version of this apparatus variant consists in that during the time in which the apparatus is kept in the state of relaxation, the control module CM causes the connection of the top plate of the sampling capacitor $C_n$ and the top plates of the capacitors $C_{n-1}$, $C_{n-2}$, . . . , $C_1$, $C_0$ in the array A to the first rail L, and the connection of the bottom plate of the sampling capacitor $C_n$ and the bottom plates of the capacitors $C_{n-1}$, $C_{n-2}$, . . . , $C_1$, $C_0$ to the ground of the circuit through the closure of the relevant on-off switches and the switching of the relevant change-over switches (FIG. 6) enforcing in this way a complete discharge of the sampling capacitor $C_n$ and of the capacitors $C_{n-1}$, $C_{n-2}$, . . . , $C_1$, $C_0$. As soon as the control module CM detects the start of the converted time interval signaled on the time interval signal input InT of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}$, . . . , $I_1$, $I_0$, the opening of the first on-off switches $S_{Ln-2}$, . . . , $S_{L1}$, $S_{L0}$ and thereby the disconnection of the top plates of the capacitors $C_{n-2}$, . . . , $C_1$, $C_0$ in the array A from the first rail L and also the switching of the change-over switches $S_{Gn-2}$, . . . , $S_{G1}$, $S_{G0}$ and thereby the connection of the bottom plates of the capacitors $C_{n-2}$, . . . , $C_1$, $C_0$ to the source of auxiliary voltage $U_H$. At the same time, by means of the control signal provided on the output $A_I$, the control module CM causes the switching on the current source I (FIG. 9). At the same time, the control module CM deactivates the signal provided on the complete conversion signal output OutR and assigns the initial value zero to all the bits $b_{n-1}$, $b_{n-2}$, . . . , $b_1$, $b_0$ in the digital word. The electric charge delivered by the use of the current source I is accumulated in the capacitor $C_{n-1}$ having the highest capacitance in the array A of capacitors and at the same time in the sampling capacitor $C_n$ connected in parallel to the capacitor $C_{n-1}$ in the array A of capacitors. The sampling capacitor $C_n$ and the capacitor $C_{n-1}$ in the array A are the only capacitors that are connected during the converted time interval to the other end of the current source I through the first rail L and through the closed first on-off switches $S_{Ln}$, and $S_{Ln-1}$.

When the control module CM detects the end of the converted time interval signaled on the time interval signal input InT of the apparatus, the control module CM causes, by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ in the array A from the second rail H (FIG. 8). At the same time, the control module CM causes, by means of the control signal provided on the output $A_S$, the switching of the change-over switch $S_I$ and thereby the connection of the one end of the current source I to the second rail H. Next, the control module CM assigns the function of the source capacitor $C_i$ to the sampling capacitor $C_n$ by writing the value of the index of the sampling capacitor $C_n$ to the source capacitor $C_i$ index register in the control module CM. Next, the control module CM causes, by means of the control signal provided on the output $D_i$, the closure of the second on-off switch $S_{Hi}$ and thereby the connection of the top plate of the source capacitor $C_i$ to the second rail H. At the same time, the control module CM assigns the function of the destination capacitor $C_k$ to the capacitor $C_{n-1}$ having the highest capacitance value in the array A by writing the value of the index of the capacitor $C_{n-1}$ to the destination capacitor $C_k$ index register in the control module CM. Next, the control module CM starts to control the process of redistribution of accumulated charge. This process is terminated when the capacitor $C_0$ having the lowest capacitance value in the array A stops to act as the destination capacitor $C_k$. After that, the control module CM activates the signal provided on the complete conversion signal output OutR, and causes introducing the apparatus into the relaxation phase again.

The operation of the another variant of the apparatus consists in that between successive cycles of conversion of time intervals to digital words having a number of bits equal to n, the control module CM keeps the apparatus in the state of relaxation during which the control module CM causes, by means of the control signals provided on the outputs $I_{n-1}$, $I_{n-2}$, . . . , $I_1$, $I_0$, the closure of the first on-off switches $S_{Ln-1}$, $S_{Ln-2}$, . . . , $S_{L1}$, $S_{L0}$ and thereby the connection of the top plates of all the capacitors $C_{n-1}$, $C_{n-2}$, . . . , $C_1$, $C_0$ in the array A to the first rail L and also the switching of the change-over switches $S_{Gn-1}$, $S_{Gn-2}$, . . . , $S_{G1}$, $S_{G0}$ and thereby the connection of the bottom plates of the capacitors $C_{n-1}$, $C_{n-2}$, . . . , $C_1$, $C_0$ to the ground of the circuit. On the other hand, by means of the control signal provided on the output $D_{all}$, the control module CM causes the closure of the first rail on-off switch $S_{Gall}$ and thereby the connection of the first rail L to the ground of the circuit enforcing in this way a complete discharge of the capacitors $C_{n-1}$, $C_{n-2}$, . . . , $C_1$, $C_0$ in the array A. Afterwards, the control module CM causes, by means of the control signal provided on the output $D_{n-1}$, the closure of the second on-off switch $S_{Hn-1}$, and thereby the connection of the second rail H to the first rail L and to the ground of the circuit which prevents the occurrence of a random potential on the second rail H. At the same time, the control module CM causes, by means of the control signals provided on the outputs $D_{n-2}$, . . . , $D_1$, $D_0$, the opening of the second on-off switches $S_{Hn-2}$, . . . , $S_{H1}$, $S_{H0}$. Moreover, by means of the control signal provided on the output $A_I$, the control module CM causes the switching off the current source I, while by means of the control signal provided on the output $A_J$, the control module CM causes the switching off the current source J (FIG. 11).

As soon as the control module CM detects the start of the time interval signaled on the time interval signal input InT of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}$, . . . , $I_1$, $I_0$, the opening of the first on-off switches $S_{Ln-2}$, . . . , $S_{L1}$, $S_{L0}$ and thereby the disconnection of the top plates of the capacitors $C_{n-2}$, . . . , $C_1$, $C_0$ in the array A from the first rail L and also the switching of the change-over switches $S_{Gn-2}$, . . . , $S_{G1}$, $S_{G0}$ and thereby the connection of the bottom plates of the capacitors $C_{n-2}$, . . . , $C_1$, $C_0$ to the source of auxiliary voltage $U_H$. At the same time, by means of the control signal provided on the output $A_I$, the control module CM causes the switching on the current source I. At the same time, the control module CM deactivates the signal provided on the complete conversion signal output OutR and assigns the initial value zero to all the bits $b_{n-1}$, $b_{n-2}$, . . . , $b_1$, $b_0$ in the digital word. At the same time, the control module CM assigns the function of the charge collecting capacitor $C_x$ to the capacitor $C_{n-1}$ having the highest capacitance value in the array A where the index of the charge collecting capacitor $C_x$ is defined by the content of the destination capacitor $C_k$ index register in the control module CM by writing the value of the index of the capacitor $C_{n-1}$ to the destination capacitor $C_k$ index register (FIG. 12). The electric charge delivered by the use of the current source I is accumulated at first in the capacitor $C_{n-1}$ in the array A which is the only capacitor connected at that time to the other end of the current source I through the first rail L and through the closed first on-off switch $S_{Ln-1}$. Accumulation of charge in the capacitor $C_x$ causes a progressive increase of the voltage $U_x$ on that capacitor. The voltage $U_x$ is compared to the reference voltage $U_L$ of a fixed value by the second comparator K2. When the voltage $U_x$ on the capacitor $C_x$, in which the charge is accumulated, reaches the reference voltage $U_L$ value during the converted time interval, the control module CM assigns the value one to the bit $b_x$ of the digital word on the output B of the apparatus on the basis of the output signal of the second comparator K2. At the same time, the control module CM causes, by means of the control signal provided on the output $I_x$, the opening of the first on-off switch $S_{Lx}$ and thereby the disconnection of the top plate of the charged capacitor $C_x$ from the first rail L, and also the concurrent switching of the change-over switch $S_{Gx}$ and thereby the connection of the bottom plate of the capacitor $C_x$ to the source of auxiliary voltage $U_H$. Next, by reduction of the content of the destination capacitor $C_k$ index register by one, the control module CM assigns the function of the charge collecting capacitor $C_x$ to the subsequent capacitor in the array A having the capacitance value twice as lower as the capacitance value of the capacitor which acted as the charge collecting capacitor directly before. Afterwards, the control module CM causes, by means of the control signal provided on the output $I_x$, the closure of the first on-off switch $S_{Lx}$ and thereby the connection of the top plate of the capacitor $C_x$ through the first rail L to the other end of the current source I and also the concurrent switching of the change-over switch $S_{Gx}$ and thereby the connection of the bottom plate of the capacitor $C_x$ to the ground of the circuit. The electric charge delivered by the use of the current source I is then accumulated in the subsequent capacitor $C_x$ which is the only capacitor connected at that time to the other end of the current source I through the first rail L and through the closed first on-off switch $S_{Lx}$ (FIG. 13). Each time the voltage $U_x$ increasing on the capacitor $C_x$ reaches the reference voltage $U_L$ value during the converted time interval, which is signaled to the control module CM by the second comparator K2, the cycle is repeated again with the subsequent capacitor in the array A having the capacitance value twice as lower as the capacitance value of the capacitor which acted as the charge collecting capacitor directly before.

When the control module CM detects the end of the converted time interval signaled on the time interval signal input InT of the apparatus, the control module CM causes, by means of the control signal provided on the output $A_I$, the switching off the current source I. At the same time, the control module CM causes, by means of the control signal provided on the output $I_x$, the opening of the first on-off switch $S_{Lx}$ and thereby the disconnection of the top plate of the capacitor $C_x$ from the first rail L, and also the concurrent switching of the change-over switch $S_{Gx}$ and thereby the connection of the bottom plate of the capacitor $C_x$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ from the second rail H. Next, by writing the content of the destination capacitor $C_k$ index register to the source capacitor $C_i$ index register in the control module CM, the control module CM assigns the function of the source capacitor $C_i$, whose index is defined by the content of the source capacitor $C_i$ index register, to the capacitor $C_x$ which accumulated charge as the last capacitor. At the same time, the control module CM causes, by means of the control signal provided on the output $D_i$, the closure of the second on-off switch $S_{Hi}$, and thereby the connection of the top plate of the source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A, whose capacitance value is twice as lower as the capacitance value of the source capacitor $C_i$. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Next, the control module CM causes, by means of the control signal provided on the output $A_J$, the switching on the additional current source J. The charge accumulated in the source capacitor $C_i$ is transferred by the use of the additional current source J through the second rail H and through the first rail L to the destination capacitor $C_k$ (FIG. 14) while the voltage $U_i$ on the source capacitor $C_i$ progressively decreases whereas at the same time the voltage $U_k$ on the destination capacitor $C_k$ progressively increases during the charge transfer.

In case when the voltage $U_k$ on the current destination capacitor $C_k$ reaches the reference voltage $U_L$ value during the charge transfer, the control module CM on the basis of the output signal of the second comparator K2 assigns the value one to the relevant bit $b_k$ in the digital word, and the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Afterwards, by reduction of the content of the destination capacitor $C_k$ index register by one, the control module CM assigns the function of the destination capacitor $C_k$ to the subsequent capacitor in the array A, whose capacitance value is twice as lower as the capacitance value of the capacitor which acted as the destination capacitor directly before. After that, the control module CM causes, by means of the control signal provided on the output $I_k$, the closure of the first on-off switch $S_{Lk}$ and thereby the connection of the top plate of a new destination capacitor $C_k$ to the first rail L, and also the concurrent switching of the change-over switch $S_{Gk}$ and thereby the connection of the bottom plate of the destination capacitor $C_k$ to the ground of the circuit.

In case when the voltage $U_i$ on the source capacitor $C_i$ reaches the value zero during the charge transfer, the control module CM on the basis of the output signal of the first comparator K1 causes, by means of the control signal provided on the output $D_i$, the opening of the second on-off switch $S_{Hi}$ and thereby the disconnection of the top plate of the source capacitor $C_i$ from the second rail H. At the same time, the control module CM causes, by means of the control signal provided on the output $I_k$, the opening of the first on-off switch $S_{Lk}$ and thereby the disconnection of the top plate of the destination capacitor $C_k$ from the first rail L, and also the concurrent switching of the change-over switch $S_{Gk}$ and thereby the connection of the bottom plate of the destination capacitor $C_k$ to the source of auxiliary voltage $U_H$. Next, the control module CM on the basis of the output signal of the first comparator K1 by writing the current content of the destination capacitor $C_k$ index register to the source capacitor $C_i$ index register, assigns the function of the source capacitor $C_i$ to the capacitor that until now has acted as the destination capacitor $C_k$, and after that, the control module CM causes, by means of the control signal provided on the output $D_i$, the closure of the second on-off switch $S_{Hi}$ and thereby the connection of the top plate of a new source capacitor $C_i$ to the second rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A whose capacitance value is twice as lower as the capacitance value of the source capacitor $C_i$. After that, the control module CM causes, by means of the control signal provided on the output $I_k$, the closure of the first on-off switch $S_{Lk}$ and thereby the connection of the top plate of a new destination capacitor $C_k$ to the first rail L, and also the concurrent switching of the change-over switch $S_{Gk}$ and thereby the connection of the bottom plate of the new destination capacitor $C_k$ to the ground of the circuit.

In both cases the control module CM continues the process of charge redistribution on the basis of the output signals of both comparators K1 and K2. Each occurrence of the active state on the output of the second comparator K2 causes the assignment of the function of the destination capacitor $C_k$ to the subsequent capacitor in the array A whose capacitance value is twice as lower as the capacitance value of the capacitor which acted as the destination capacitor directly before. On the other hand, each occurrence of the active state on the output of the first comparator K1 causes the assignment of the function of the source capacitor $C_i$ to the capacitor that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before.

The process of charge redistribution is terminated when the capacitor $C_0$ having the lowest capacitance value in the array A stops to act as the destination capacitor $C_k$. Such situation occurs when the active state appears on the output of the first comparator K1 or on the output of the second comparator K2 during charge transfer to the capacitor $C_0$. When the active state appears on the output of the second comparator K2, the control module CM assigns the value one to the bit $b_0$.

After termination of redistribution of charge accumulated in the capacitor $C_x$ which is the last capacitor accumulating the charge delivered by the use of the current source I during the converted time interval, and after assigning the corresponding values to the bits $b_{n-1}$, $b_{n-2}$, . . . , $b_1$, $b_0$ in the output digital word, the control module CM activates the signal provided on the complete conversion signal output OutR and causes introduction of the apparatus into the relaxation phase by switching off the additional current source J, also the closure of the first on-off switches $S_{Ln-1}$, $S_{Ln-2}$, . . . , $S_{L1}$, $S_{L0}$ and thereby the connection of the top plates of all the capacitors $C_{n-1}$, $C_{n-2}$, . . . , $C_1$, $C_0$ in the array A to the first rail L, and also the concurrent switching of the change-over switches $S_{Gn-1}$, $S_{Gn-2}$, . . . , $S_{G1}$, $S_{G0}$ to positions connecting the bottom plates of all the capacitors $C_{n-1}$, $C_{n-2}$, . . . , $C_1$, $C_0$ to the ground of the circuit. At the same time, the control module causes the closure of the first rail on-off switch $S_{Gall}$ and thereby the connection of the first rail L to the ground of the circuit, enforcing a complete discharge of the capacitors $C_{n-1}$, $C_{n-2}$, . . . , $C_1$, $C_0$ in the array A and also the opening of the second on-off switches $S_{Hn-2}$, . . . , $S_{H1}$, $S_{H0}$ in the array A, the closure of the second on-off switch $S_{Hn-1}$ and thereby the connection of the second rail H to the first rail L and to the ground of the circuit (FIG. 11), which prevents the occurrence of a random potential on the second rail H.

The operation of the another version of this apparatus variant consists in that during the time in which the apparatus is kept in the state of relaxation, the control module CM causes the connection of the top plate of the sampling capacitor $C_n$ and the connection of the top plates of the capacitors $C_{n-1}$, $C_{n-2}$, . . . , $C_1$, $C_0$ in the array A to the first rail L, and the connection of the bottom plate of the sampling capacitor $C_n$ and the connection of the bottom plates of the capacitors $C_{n-1}$, $C_{n-2}$, . . . , $C_1$, $C_0$ to the ground of the circuit through the closure of the relevant on-off switches (FIG. 15) and the switching of the relevant change-over switches enforcing in this way a complete discharge of the sampling capacitor $C_n$ and of the capacitors $C_{n-1}$, $C_{n-2}$, . . . , $C_1$, $C_0$. At the same time, the control module CM causes, by means of the control signal provided on the output $D_n$, the closure of the second on-off switch $S_{Hn}$ and thereby the connection of the second rail H to the first rail L and to the ground of the circuit which prevents the occurrence of a random potential on the second rail H. At the same time, the control module CM causes, by means of the control signals provided on the outputs $D_{n-1}$, $D_{n-2}$, . . . , $D_1$, $D_0$, the opening of the second on-off switches $S_{Hn-1}$, $S_{Hn-2}$, . . . , $S_{H1}$, $S_{H0}$ and thereby the disconnection of the top plates of the capacitors $C_{n-1}$, $C_{n-2}$, . . . , $C_1$, $C_0$ in the array A from the second rail H.

As soon as the control module CM detects the start of the converted time interval signaled on the time interval signal input InT of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-1}$, $I_{n-2}$, . . . , $I_1$, $I_0$, the opening of the first on-off switches $S_{Ln-1}$, $S_{Ln-2}$, . . . , $S_{L1}$, $S_{L0}$ and thereby the disconnection of the top plates of the capacitors $C_{n-1}$, $C_{n-2}$, . . . , $C_1$, $C_0$ in the array A from the first rail L and also the switching of the change-over switches $S_{Gn-1}$, $S_{Gn-2}$, . . . , $S_{G1}$, $S_{G0}$ and thereby the connection of the bottom plates of the capacitors $C_{n-1}$, $C_{n-2}$, . . . , $C_1$, $C_0$ to the source of auxiliary voltage $U_H$. At the same time, by means of the control signal provided on the output $A_I$, the control module CM causes the switching on the current source I (FIG. 16). At the same time, the control module CM deactivates the signal provided on the complete conversion signal output OutR and assigns the initial value zero to all the bits $b_{n-1}$, $b_{n-2}$, . . . , $b_1$, $b_0$ in the digital word. The electric charge delivered by the use of the current source I is accumulated in the sampling capacitor $C_n$ which is the only capacitor connected during the converted time interval to the other end of the current source I through the first rail L and through the closed first on-off switch $S_{Ln}$.

When the control module CM detects the end of the converted time interval signaled on the time interval signal input InT of the apparatus, the control module CM causes, by means of the control signal provided on the output $A_i$, switching off the current source I. At the same time, the control module CM causes by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$ (FIG. 17). Next, the control module CM assigns the function of the source capacitor $C_i$ to the sampling capacitor $C_n$ by writing the value of the index of the sampling capacitor $C_n$ to the source capacitor $C_i$ index register in the control module CM. At the same time, the control module CM assigns the function of the destination capacitor $C_k$ to the capacitor $C_{n-1}$ having the highest capacitance value in the array A by writing the value of the index of the capacitor $C_{n-1}$ to the destination capacitor $C_k$ index register in the control module CM. Then, the control module CM causes, by means of the control signal provided on the output $I_k$, the closure of the first on-off switch $S_{Lk}$ and thereby the connection of the top plate of the destination capacitor $C_k$ to the first rail L, and also the concurrent switching of the change-over switch $S_{Gk}$ and thereby the connection of the bottom plate of the destination capacitor $C_k$ to the ground of the circuit. Next, the control module CM causes, by means of the control signal provided on the output $A_J$, the switching on the additional current source J, and the control module CM starts to control the process of redistribution of accumulated charge. This process is terminated when the capacitor $C_0$ having the lowest capacitance value in the array A stops to act as the destination capacitor $C_k$. After that, the control module CM activates the signal provided on the complete conversion signal output OutR and causes introducing the apparatus into relaxation phase again.

The operation of the another version of this apparatus variant consists in that during the time in which the apparatus is kept in the state of relaxation, the control module CM causes the connection of the top plate of the sampling capacitor $C_n$ and the connection of the top plates of the capacitors $C_{n-1}$, $C_{n-2}$, . . . , $C_1$, $C_0$ in the array A to the first rail L, and the connection of the bottom plate of the sampling capacitor $C_n$ and the connection of the bottom plates of the capacitors $C_{n-1}$, $C_{n-2}$, . . . , $C_1$, $C_0$ to the ground of the circuit through the closure of the relevant on-off switches and the switching of the relevant change-over switches (FIG. 15) enforcing in this way a complete discharge of the sampling capacitor $C_n$ and of the capacitors $C_{n-1}, C_{n-2}, \ldots, C_1, C_0$. At the same time, the control module CM causes, by means of the control signal provided on the output $D_n$, the closure of the second on-off switch $S_{Hn}$ and thereby the connection of the second rail H to the first rail L and to the ground of the circuit which prevents the occurrence of a random potential on the second rail H. At the same time, the control module CM causes, by means of the control signals provided on the outputs $D_{n-1}, D_{n-2}, \ldots, D_1, D_0$, the opening of the second on-off switches $S_{Hn-1}, S_{Hn-2}, \ldots, S_{H1}, S_{H0}$ and thereby the disconnection of the top plates of the capacitors $C_{n-1}, C_{n-2}, \ldots, C_1, C_0$ in the array A from the second rail H.

As soon as the control module CM detects the start of the converted time interval signaled on the time interval signal input InT of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-1}, I_{n-2}, \ldots, I_1, I_0$, the opening of the first on-off switches $S_{Ln-1}, S_{Ln-2}, \ldots, S_{L1}, S_{L0}$ and thereby the disconnection of the top plates of the capacitors $C_{n-1}, C_{n-2}, \ldots, C_1, C_0$ in the array A from the first rail L and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the source of auxiliary voltage $U_H$. At the same time, by means of the control signal provided on the output $A_I$, the control module CM causes the switching on the current source I (FIG. 18). At the same time, the control module CM deactivates the signal provided on the complete conversion signal output OutR and assigns the initial value zero to all the bits $b_{n-1}, b_{n-2}, \ldots, b_1, b_0$ in the digital word. The electric charge delivered by the use of the current source I is accumulated in the capacitor $C_{n-1}$ having the highest capacitance in the array A of capacitors and at the same time in the sampling capacitor $C_n$ connected in parallel to the capacitor $C_{n-1}$ in the array A of capacitors. The sampling capacitor $C_n$ and the capacitor $C_{n-1}$ in the array A are the only capacitors that are connected during the converted time interval to the other end of the current source I through the first rail L and through the closed first on-off switches $S_{Ln}$ and $S_{Ln-1}$. When the control module CM detects the end of the converted time interval signaled on the time interval signal input InT of the apparatus, the control module CM causes, by means of the control signal provided on the output $A_I$, the switching off the current source I. At the same time, the control module CM causes, by means of the control signal provided on the output $I_n$, the opening of the first on-off switch $S_{Ln}$ and thereby the disconnection of the top plate of the sampling capacitor $C_n$ from the first rail L, and also the concurrent switching of the change-over switch $S_{Gn}$ and thereby the connection of the bottom plate of the sampling capacitor $C_n$ to the source of auxiliary voltage $U_H$ (FIG. 17). Next, the control module CM assigns the function of the source capacitor $C_i$ to the sampling capacitor $C_n$ by writing the value of the index of the sampling capacitor $C_n$ to the source capacitor $C_i$ index register in the control module CM. At the same time, the control module CM assigns the function of the destination capacitor $C_k$ to the capacitor $C_{n-1}$ having the highest capacitance value in the array A by writing the value of the index of the capacitor $C_{n-1}$ to the destination capacitor $C_k$ index register in the control module CM. Next, the control module CM causes, by means of the control signal provided on the output $A_J$, the switching on the additional current source J, and the control module CM starts to control the process of redistribution of accumulated charge. This process is terminated when the capacitor $C_0$ having the lowest capacitance value in the array A stops to act as the destination capacitor $C_k$. After that, the control module CM activates the signal provided on the complete conversion signal output OutR, and causes introducing the apparatus into the relaxation phase again.

ABBREVIATIONS

A array of capacitors
CM control module
K1 first comparator
K2 second comparator
I current source
J additional current source
$U_L$ source of the reference voltage
$U_H$ source of auxiliary voltage
$U_{DD}$ voltage supply
InT time interval signal input
In1 first control input of the control module
In2 second control input of the control module
B digital output of the control module
E set of control outputs of the control module
OutR complete conversion signal output
L first rail
H second rail
$C_{n-1}, C_{n-2}, \ldots, C_1, C_0$ capacitors in the array of capacitors
$C_n$ sampling capacitor
$C_x$ charge collecting capacitor
$C_i$ source capacitor
$C_k$ destination capacitor
$U_{n-1}, U_{n-2}, \ldots, U_1, U_0$ voltages on the capacitors in the array of capacitors
$U_n$ voltage on the sampling capacitor
$U_x$ voltage on the charge collecting capacitor
$U_i$ voltage on the source capacitor
$U_k$ voltage on the destination capacitor
$b_{n-1}, b_{n-2}, \ldots, b_1, b_0$ bits in the digital word
$S_{Ln}, S_{ln-1}, S_{ln-2}, \ldots, S_{Lx}, S_{L1}, S_{L0}$ first on-off switches
$S_{Hn}, S_{Hn-1}, S_{Hn-2}, \ldots, S_{Hx}, \ldots, S_{H1}, S_{H0}$ second on-off switches
$S_{Gn}, S_{Gn-1}, S_{Gn-2}, \ldots, S_{Gx}, \ldots, S_{G1}, S_{G0}$ change-over switches
$S_{Gall}$ first rail on-off switch
$S_I$ current source change-over switch
$A_I, A_J, A_S$ control outputs of the control module
$I_n, I_{n-1}, I_{n-2}, \ldots, I_x, \ldots, I_1, I_0$ control outputs of the control module
$D_n, D_{n-1}, D_{n-2}, \ldots, D_x, \ldots, D_1, D_0, D_{Gall}$ control outputs of the control module

The invention claimed is:

1. A method for the conversion of a time interval to a digital word, wherein the time interval, whose both start and end are detected by the use of a control module (CM), is mapped to a portion of electric charge proportional to the time interval, while the portion of electric charge is delivered during the time interval by the use of a current source (I) and is accumulated in an array (A) of capacitors ($C_{n-1}, C_{n-2}, \ldots, C_1, C_0$) whereas a capacitance value of a capacitor of a given index ($C_i$) is twice as high as a capacitance value of the capacitor of a previous index ($C_{i-1}$) and charge accumulation is started from the capacitor ($C_{n-1}$) having the highest capacitance value in the array (A) of capacitors and is realized from the start of the time interval to the end of the time interval detected by means of the control module (CM) or until the voltage ($U_{n-1}$), which increases on the capacitor ($C_{n-1}$) and is simultaneously observed by the use of the second comparator (K2), equals the reference voltage ($U_L$) value, and in the latter case the charge accumulation is continued in the subsequent capacitor in the array (A) of capacitors whose capacitance value is twice lower than the capacitance value of the capacitor in which charge was accumulated directly before, and at the same time the voltage, increasing on the capacitor in which charge is currently accumulated, is compared to the reference voltage ($U_L$) value by the use of the second comparator (K2), and the cycle is repeated until the end of the time interval is detected by means of the control module (CM), and afterwards, a function of the source capacitor ($C_i$), whose index is defined by the content of the source capacitor ($C_i$) index register in the control module (CM), is assigned by means of the control module (CM) to a capacitor ($C_x$) in the array (A) of capacitors by writing the value of the index of the capacitor ($C_x$) to the source capacitor ($C_i$) index register where the capacitor ($C_x$) is the last capacitor in which charge was accumulated, a function of the destination capacitor ($C_k$) whose index is defined by the content of the destination capacitor ($C_k$) index register in the control module (CM) is assigned by means of the control module (CM) to the subsequent capacitor in the array (A) whose capacitance value is twice lower than the capacitance value of the source capacitor ($C_i$) by writing a value stored in the source capacitor ($C_i$) index register reduced by one to the destination capacitor ($C_k$) index register, and then, the electric charge accumulated in the source capacitor ($C_i$) is transferred to the destination capacitor ($C_k$) by the use of the current source (I) and at the same time a voltage ($U_k$) increasing on the destination capacitor ($C_k$) is compared to the reference voltage ($U_L$) value by the use the second comparator (K2), and also a voltage ($U_i$) on the source capacitor ($C_i$) is observed by the use of the first comparator (K1), and when the voltage ($U_i$) on the source capacitor ($C_i$) observed by the use of the first comparator (K1) equals zero during the charge transfer, the function of the source capacitor ($C_i$) is assigned to the current destination capacitor ($C_k$) by means of the control module (CM) on the basis of an output signal of the first comparator (K1) by writing a current content of the destination capacitor ($C_k$) index register in the control module (CM) to the source capacitor ($C_i$) index register in the control module (CM), and also the function of the destination capacitor ($C_k$) is assigned to the subsequent capacitor in the array (A) whose capacitance value is twice lower than the capacitance value of the capacitor that operated as the destination capacitor directly before by reducing the content of the destination capacitor ($C_k$) index register by one, and charge transfer from a new source capacitor ($C_i$) to a new destination capacitor ($C_k$) is continued by the use of the current source (I), and when the voltage ($U_k$) on the destination capacitor ($C_k$) observed by the use of the second comparator (K2) equals the reference voltage ($U_L$) value during the transfer of charge from the source capacitor ($C_i$) to the destination capacitor ($C_k$), the function of the destination capacitor ($C_k$) is assigned by means of the control module (CM) on the basis of an output signal of the second comparator (K2) to the subsequent capacitor in the array (A) whose capacitance value is twice lower than the capacitance value of the capacitor that operated as the destination capacitor directly before by reducing the content of the destination capacitor ($C_k$) index register by one, and also the charge transfer from the source capacitor ($C_i$) to a new destination capacitor ($C_k$) is continued, while this process is still controlled by means of the control module (CM) on the basis of the output signals of the comparators (K1) and (K2) until the voltage ($U_i$) on the source capacitor ($C_i$) observed by the use of the first comparator (K1) equals zero during a period in which the function of the destination capacitor ($C_k$) is assigned to the capacitor ($C_0$) having the lowest capacitance value in the array (A) of capacitors, or the voltage ($U_0$) increasing on the capacitor ($C_0$) and observed at the same time by the use of the second comparator (K2) equals the reference voltage ($U_L$) value while the value one is assigned to these bits in the digital word, corresponding to the capacitors in the array (A) of capacitors, on which the voltage equal to the reference voltage ($U_L$) value has been obtained, and the value zero is assigned to the other bits by means of the control module (CM).

2. The method according to claim 1, wherein electric charge is delivered by the use of the current source (I) and is accumulated in the sampling capacitor ($C_n$) during the time interval whose both start and end are detected by means of the control module (CM), and after detecting the end of the time interval by means of the control module (CM), the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that, the process of electric charge transfer from the source capacitor ($C_i$) to the destination capacitor ($C_k$) is realized by the use of the current source (I) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is simultaneously observed by the use of the second comparator (K2), equals the reference voltage ($U_L$) value.

3. The method according to claim 1, wherein electric charge is delivered by the use of the current source (I) and is accumulated during the time interval, whose both start and end are detected by means of the control module (CM), in the capacitor ($C_{n-1}$) having the highest capacitance value in the array (A) of capacitors and at the same time in the sampling capacitor ($C_n$) connected in parallel to the capacitor ($C_{n-1}$) in the array (A) of capacitors where the capacitance value of the sampling capacitor ($C_n$) is not smaller than the capacitance value of the capacitor ($C_{n-1}$), and after detecting the end of the time interval by means of the control module (CM), the function of the source capacitor ($C_i$), whose index is defined by the content of the source capacitor ($C_i$) index register in the control module (CM), is assigned by means of the control module (CM) to the sampling capacitor ($C_n$) by writing the value of the index of the sampling capacitor ($C_n$) to the source capacitor ($C_i$) index register, and also the function of the destination capacitor ($C_k$), whose index is defined by the content of the destination capacitor ($C_k$) index register in the control module (CM), is assigned by means of the control module (CM) to the capacitor ($C_{n-1}$) in the array (A) of capacitors by writing the value of the index of the capacitor ($C_{n-1}$) in the array (A) of capacitors to the destination capacitor ($C_k$) index register, and after that, the process of the electric charge transfer from the source capacitor ($C_i$) to the destination capacitor ($C_k$) is realized by the use of the current source (I) while the process of charge transfer is controlled by means of the control module (CM) on the basis of the output signals of the comparators (K1) and (K2) until the voltage ($U_i$) on the source capacitor ($C_i$) observed by the use of the first comparator (K1) equals zero during the period when the function of the destination capacitor ($C_k$) is assigned to the capacitor ($C_0$) having the lowest capacitance value in the array (A) of capacitors, or the voltage ($U_0$), which increases on the capacitor ($C_0$) and is simultaneously observed by the use of the second comparator (K2), equals the reference voltage ($U_L$) value.

4. The method according to claim 1, wherein after detecting the end of the time interval by means of the control module (CM) and after writing the values of indexes of relevant capacitors to the source capacitor ($C_i$) index register and to the destination capacitor ($C_k$) index register by means of the control module (CM), the process of charge redistribution is realized during which charge is transferred from the source capacitor ($C_i$) to the destination capacitor ($C_k$) by the use of the additional current source (J), whose effectiveness is different from the effectiveness of the current source (I), and the process of charge redistribution is controlled by means of the control module (CM) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is simultaneously observed by the use of the second comparator (K2), equals the reference voltage ($U_L$) value.

5. The method according to claim 1, wherein that electric charge is delivered by the use of the current source (I) and is accumulated in the sampling capacitor ($C_n$) during the time interval, whose both start and end are detected by means of the control module (CM), and after detecting the end of this time interval by means of the control module (CM), the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$), whose index is defined by the content of the destination capacitor ($C_k$) index register in the control module (CM), is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that, the process of redistribution of accumulated electric charge is realized during which charge is transferred from the source capacitor ($C_i$) to the destination capacitor ($C_k$) by the use of the additional current source (J), whose effectiveness is different from the effectiveness of the current source (I), and the process of charge redistribution is controlled by means of the control module (CM) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is simultaneously observed by the use of the second comparator (K2), equals the reference voltage ($U_L$) value.

6. The method according to claim 1, wherein electric charge is delivered by the use of the current source (I) and is accumulated during the time interval, whose both start and end are detected by means of the control module (CM) in the capacitor ($C_{n-1}$) having the highest capacitance value in the array (A) of capacitors and at the same time in the sampling capacitor ($C_n$) connected in parallel to the capacitor ($C_{n-1}$) in the array (A) of capacitors where the capacitance value of the sampling capacitor ($C_n$) is not smaller than the capacitance value of the capacitor ($C_{n-1}$) and after detecting the end of the time interval by means of the control module (CM), the function of the source capacitor ($C_i$), whose index is defined by the content of the source capacitor ($C_i$) index register in the control module (CM), is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) in the array (A) of capacitors by writing the value of the index of the capacitor ($C_{n-1}$) in the array (A) of capacitors to the destination capacitor ($C_k$) index register, and after that, the process of redistribution of accumulated electric charge is realized during which charge is transferred from the source capacitor ($C_i$) to the destination capacitor ($C_k$) by the use of the additional current source (J), whose effectiveness is different from the effectiveness of the current source (I), and the process of charge redistribution is controlled by means of the control module (CM) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_0$) having the lowest capacitance value in the array (A) of capacitors, or the voltage ($U_0$), which increases on the capacitor ($C_0$) and is simultaneously observed by the use of the second comparator (K2), equals the reference voltage ($U_L$) value.

7. An apparatus for the conversion of a time interval to a digital word containing the control module equipped with a digital output wherein the apparatus comprises an array (A) of capacitors whose control inputs are connected to a set of control outputs (E) of the control module (CM), and the control module (CM) is equipped with the digital output (B), the complete conversion signal output (OutR), the time interval signal input (InT) and two control inputs (In1) and (In2) where the first control input (In1) is connected to the output of the first comparator (K1) whose inputs are connected to one pair of outputs of the array (A) of capacitors, and the other control input (In2) of the control module (CM) is connected to the output of the second comparator (K2) whose inputs are connected to other pair of outputs of the array (A), and furthermore, a voltage supply ($U_{DD}$), a source of auxiliary voltage ($U_H$) together with a source of the reference voltage ($U_L$) and a controlled current source (I) are connected to the array (A) of capacitors, and the control input of the controlled current source (I) is connected to the control output ($A_1$) of the control module (CM).

8. The apparatus according to claim 7, wherein the array (A) of capacitors comprises a number of n capacitors ($C_{n-1}$, $C_{n-2}$, . . . , $C_1$, $C_0$), and a capacitance value of a capacitor of a given index is twice as high as a capacitance value of the capacitor of the previous index, and the top plate of the capacitor ($C_{n-1}$) having the highest capacitance value in the array (A) of capacitors is connected through the closed first on-off switch ($S_{Ln-1}$) to the first rail (L) with which the top plates of the other capacitors ($C_{n-2}$, . . . , $C_1$, $C_0$) in the array (A) of capacitors are connected through the open first on-off switches ($S_{Ln-2}$, . . . , $S_{L1}$, $S_{L0}$), while the top plate of the capacitor ($C_{n-1}$) is also connected through the closed second on-off switch ($S_{Hn-1}$) to the second rail (H) with which the top plates of the other capacitors ($C_{n-2}$, . . . , $C_1$, $C_0$) of the array (A) are connected through the open second on-off switches ($S_{Hn-2}$, . . . , $S_{H1}$, $S_{H0}$), and the bottom plate of the capacitor ($C_{n-1}$) is connected to the ground of the circuit through the change-over switch ($S_{Gn-1}$) whose moving contact is connected to its first stationary contact and the other stationary contact of the change-over switch ($S_{G-1}$) is connected to the source of auxiliary voltage ($U_H$) and also to the non-inverting input of the first comparator (K1), while the bottom plates of the other capacitors ($C_{n-2}$, . . . , $C_1$, $C_0$) of the array (A) are connected to the source of auxiliary voltage ($U_H$) through the change-over switches ($S_{Gn-2}$, . . . , $S_{G1}$, $S_{G0}$) whose moving contacts are connected to their other stationary contacts, and the first stationary contacts of the change-over switches ($S_{Gn-2}$, . . . , $S_{G1}$, $S_{G0}$) are connected to the ground of the circuit, whereas the first rail (L) is connected to the ground of the circuit through the open first rail on-off switch ($S_{Gall}$) and to the non-inverting input of the second comparator (K2) whose inverting input is connected to the source of the reference voltage ($U_L$), while the second rail (H) is connected to the inverting input of the first comparator (K1), and moreover, the control inputs of the first on-off switches ($S_{Ln-1}$, $S_{Ln-2}$, . . . , $S_{L1}$, $S_{L0}$) and the control inputs of the change-over switches ($S_{Gn-1}$, $S_{Gn-2}$, . . . , $S_{G1}$, $S_{G0}$) of the array (A) are coupled together and connected to the relevant control outputs ($I_{n-1}$, $I_{n-2}$, . . . , $I_1$, $I_0$) of the set of control outputs (E) of the control module (CM), while the control inputs of the second on-off switches ($S_{Hn-1}$, $S_{Hn-2}$, . . . , $S_{HE}$, $S_{H0}$) and the control input of the first rail on-off switch ($S_{Gall}$) are connected to the relevant control outputs ($D_{n-1}$, $D_{n-2}$, . . . , $D_1$, $D_0$) and ($D_{all}$) of the set of control outputs (E) of the control module (CM), while one end of the current source (I) is connected to the voltage supply ($U_{DD}$) through the current source change-over switch ($S_I$) whose moving contact is connected to its first stationary contact, and the other stationary contact of the current source change-over switch ($S_I$) is connected to the second rail (H), and the other end of the current source (I) is connected to the first rail (L), and furthermore, the control input of the current source (I) is connected to the control output ($A_I$) of the control module (CM), and the control input of the current source change-over switch ($S_I$) is connected to the control output ($A_S$) of the control module (CM).

9. The apparatus according to claim 8, wherein the sampling capacitor ($C_n$) is connected to the array (A) of capacitors, while the top plate of the sampling capacitor ($C_n$) is connected to the first rail (L) through the closed first on-off switch ($S_{Ln}$) and also it is connected to the second rail (H) through the open second on-off switch ($S_{Hn}$), whereas the bottom plate of the sampling capacitor ($C_n$) is connected to the ground of the circuit through the change-over switch ($S_{Gn}$) whose moving contact is connected to its first stationary contact, and the other stationary contact of the change-over switch ($S_{Gn}$) is connected to the source of auxiliary voltage ($U_H$), and the control input of the first on-off switch ($S_{Ln}$) and the control input of the change-over switch ($S_{Gn}$) are coupled together and connected to the control output ($I_n$) of the control module (CM), whereas the control input of the second on-off switch ($S_{Hn}$) is connected to the control output ($D_n$) of the control module (CM), and also the top plate of the capacitor ($C_{n-1}$) having the highest capacitance value in the array (A) of capacitors is connected to the first rail (L) through the open first on-off switch ($S_{Ln-1}$) and to the second rail (H) through the closed second on-off switch ($S_{Hn-1}$), while the bottom plate of the capacitor ($C_{n-1}$) is connected to the source of auxiliary voltage ($U_H$) through the change-over switch ($S_{Gn-1}$) whose moving contact is connected to its other stationary contact, whereas the first stationary contact of the change-over switch ($S_{Gn-1}$) is connected to the ground of the circuit.

10. The apparatus according to claim 8, wherein the sampling capacitor ($C_n$) is connected to the array (A) of capacitors where the capacitance value of the sampling capacitor ($C_n$) is not smaller than the capacitance value of the capacitor ($C_{n-1}$) having the highest capacitance value in the array (A) of capacitors, while the sampling capacitor ($C_n$) is connected in parallel to the capacitor ($C_{n-1}$) in the array (A) of capacitors through the first rail (L) and through the ground of the circuit in a way that the top plate of the sampling capacitor ($C_n$) is connected to the first rail (L) through the closed first on-off switch ($S_{Ln}$), and on the other hand, the bottom plate of the sampling capacitor ($C_n$) is connected to the ground of the circuit through the change-over switch ($S_{Gn}$) whose moving contact is connected to its first stationary contact, and the other stationary contact of the change-over switch ($S_{Gn}$) is connected to the source of auxiliary voltage ($U_H$), and moreover, the top plate of the sampling capacitor ($C_n$) is connected also to the second rail (H) through the open second on-off switch ($S_{Hn}$), whereas the control input of the first on-off switch ($S_{Ln}$) and the control input of the change-over switch ($S_{Gn}$) are coupled together and connected to the control output ($I_n$) of the control module (CM), and the control input of the second on-off switch ($S_{Hn}$) is connected to the control output ($D_n$) of the control module (CM).

11. The apparatus according to claim 7, wherein an additional controlled current source (J) is connected to the array (A) of capacitors, and the control input of the additional controlled current source (J) is connected to the relevant control output ($A_J$) of the control module (CM).

12. The apparatus according to claim 11, wherein the array (A) of capacitors comprises a number of n capacitors ($C_{n-1}$, $C_{n-2}$, . . . , $C_1$, $C_0$), and a capacitance value of a capacitor of a given index is twice as high as a capacitance value of the capacitor of the previous index, and the top plate of the capacitor ($C_{n-1}$) having the highest capacitance value in the array (A) of capacitors is connected through the closed first on-off switch ($S_{Ln-1}$) to the first rail (L) with which the top plates of the other capacitors ($C_{n-2}$, . . . , $C_1$, $C_0$) in the array (A) of capacitors are connected through the open first on-off switches ($S_{Ln-2}$, . . . , $S_{L1}$, $S_{L0}$), while the top plate of the capacitor ($C_{n-1}$) is also connected through the closed second on-off switch ($S_{Hn-1}$) to the second rail (H) with which the top plates of the other capacitors ($C_{n-2}$, . . . , $C_1$, $C_0$) of the array (A) are connected through the open second on-off switches ($S_{Hn-2}$, . . . , $S_{H1}$, $S_{H0}$), and the bottom plate of the capacitor ($C_{n-1}$) is connected to the ground of the circuit through the change-over switch ($S_{Gn-1}$) whose moving contact is connected to its first stationary contact and the other stationary contact of the change-over switch ($S_{Gn-1}$) is connected to the source of auxiliary voltage ($U_H$) and also to the non-inverting input of the first comparator (K1), while the bottom plates of the other capacitors ($C_{n-2}$, . . . , $C_1$, $C_0$) of the array (A) are connected to the source of auxiliary voltage ($U_H$) through the change-over switches ($S_{Gn-2}$, . . . , $S_{G1}$, $S_{G0}$) whose moving contacts are connected to their other stationary contacts, and the first stationary contacts of the change-over switches ($S_{Gn-2}$, . . . , $S_{G1}$, $S_{G0}$) are connected to the ground of the circuit, whereas the first rail (L) is connected to the ground of the circuit through the open first rail on-off switch ($S_{Gall}$) and to the non-inverting input of the second comparator (K2) whose inverting input is connected to the source of the reference voltage ($U_L$), while the second rail (H) is connected to the inverting input of the first comparator (K1), and moreover, the control inputs of the first on-off switches ($S_{Ln-1}$, $S_{Ln-2}$, . . . , $S_{L1}$, $S_{L0}$) and the control inputs of the change-over switches ($S_{Gn-1}$, $S_{Gn-2}$, . . . , $S_{G1}$, $S_{G0}$) of the array (A) are coupled together and connected to the relevant control outputs ($I_{n-1}$, $I_{n-2}$, . . . , $I_1$, $I_0$) of the set of control outputs (E) of the control module (CM), while the control inputs of the second on-off switches ($S_{Hn-1}$, $S_{Hn-2}$, . . . , $S_{H1}$, $S_{H0}$) and the control input of the first rail on-off switch ($S_{Gall}$) are connected to the relevant control outputs ($D_{n-1}$, $D_{n-2}$, . . . , $D_1$, $D_0$) and ($D_{all}$) of the set of control outputs (E) of the control module (CM), while one end of the current source (I) is connected to the voltage supply ($U_{DD}$), and the other end of the current source (I) is connected to the first rail (L), with which the other end of the additional current source (J) is also connected, whereas one end of the additional current source (J) is connected to the second rail (H), and the control input of the current source (I) is connected to the control output ($A_I$) of the control module (CM) while the control input of the additional current source (J) is connected to the control output ($A_J$) of the control module (CM).

13. The apparatus according to claim 12, wherein the sampling capacitor ($C_n$) is connected to the array (A) of capacitors, while the top plate of the sampling capacitor ($C_n$) is connected to the first rail (L) through the closed first on-off switch ($S_{Ln}$) and also it is connected to the second rail (H) through the closed second on-off switch ($S_{Hn}$), whereas the bottom plate of the sampling capacitor ($C_n$) is connected to the ground of the circuit through the change-over switch ($S_{Gn}$) whose moving contact is connected to its first stationary contact, and the other stationary contact of the change-over switch ($S_{Gn}$) is connected to the source of auxiliary voltage ($U_H$), and the control input of the first on-off switch ($S_{Ln}$) and the control input of the change-over switch ($S_{Gn}$) are coupled together and connected to the control output ($I_n$) of the control module (CM), whereas the control input of the second on-off switch ($S_{Hn}$) is connected to the control output ($D_n$) of the control module (CM), and also the top plate of the capacitor ($C_{n-1}$) having the highest capacitance value in the array (A) of capacitors is connected to the first rail (L) through the open first on-off switch ($S_{Ln-1}$) and to the second rail (H) through the open second on-off switch ($S_{Hn-1}$), while the bottom plate of the capacitor ($C_{n-1}$) is connected to the source of auxiliary voltage ($U_H$) through the change-over switch ($S_{Gn-1}$) whose moving contact is connected to its other stationary contact, whereas the first stationary contact of the change-over switch ($S_{Gn-1}$) is connected to the ground of the circuit.

14. The apparatus according to claim 12, wherein the sampling capacitor ($C_n$) is connected to the array (A) of capacitors where the capacitance value of the sampling capacitor ($C_n$) is not smaller than the capacitance value of the capacitor ($C_{n-1}$) having the highest capacitance value in the array (A) of capacitors, while the sampling capacitor ($C_n$) is connected in parallel to the capacitor ($C_{n-1}$) in the array (A) of capacitors through the first rail (L) and through the ground of the circuit in a way that the top plate of the sampling capacitor ($C_n$) is connected to the first rail (L) through the closed first on-off switch ($S_{Ln}$), and on the other hand, the bottom plate of the sampling capacitor ($C_n$) is connected to the ground of the circuit through the change-over switch ($S_{Gn}$) whose moving contact is connected to its first stationary contact, and the other stationary contact of the change-over switch ($S_{Gn}$) is connected to the source of auxiliary voltage ($U_H$), and moreover, the top plate of the sampling capacitor ($C_n$) is connected also to the second rail (H) through the closed-second on-off switch ($S_{Hn}$), whereas the control input of the first on-off switch ($S_{Ln}$) and the control input of the change-over switch ($S_{Gn}$) are coupled together and connected to the control output ($I_n$) of the control module (CM), and the control input of the second on-off switch ($S_{Hn}$) is connected to the control output ($D_n$) of the control module (CM) while the top plate of the capacitor ($C_{n-1}$) having the highest capacitance value in the array (A) of capacitors is connected to the first rail (L) through the closed first on-off switch ($S_{Ln-1}$) and also to the second rail (H) through the open second on-off switch ($S_{Hn-1}$), whereas the bottom plate of the capacitor ($C_{n-1}$) is connected to the ground of the circuit through the change-over switch ($S_{Gn-1}$) whose moving contact is connected to its other stationary contact, whereas the first stationary contact of the change-over switch ($S_{Gn-1}$) is connected to the source of auxiliary voltage ($U_H$).

* * * * *